(12) United States Patent
Onuki et al.

(10) Patent No.: US 11,996,132 B2
(45) Date of Patent: May 28, 2024

(54) THREE TRANSISTOR SEMICONDUCTOR DEVICE WITH METAL OXIDE CHANNEL REGION, OPERATION METHOD THEREOF, AND ELECTRONIC DEVICE

(71) Applicant: SEMICONDUCTOR ENERGY LABORATORY CO., LTD., Atsugi (JP)

(72) Inventors: Tatsuya Onuki, Kanagawa (JP); Kiyoshi Kato, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 408 days.

(21) Appl. No.: 17/298,964

(22) PCT Filed: Nov. 20, 2019

(86) PCT No.: PCT/IB2019/059955
§ 371 (c)(1),
(2) Date: Jun. 2, 2021

(87) PCT Pub. No.: WO2020/128676
PCT Pub. Date: Jun. 25, 2020

(65) Prior Publication Data
US 2021/0312970 A1 Oct. 7, 2021

(30) Foreign Application Priority Data
Dec. 21, 2018 (JP) ................. 2018-239486

(51) Int. Cl.
*G11C 11/405* (2006.01)
*G11C 11/4096* (2006.01)
(Continued)

(52) U.S. Cl.
CPC ........ *G11C 11/405* (2013.01); *G11C 11/4096* (2013.01); *H01L 27/1207* (2013.01);
(Continued)

(58) Field of Classification Search
CPC ............... G11C 11/405; G11C 11/4096; H01L 27/1207; H01L 27/1225; H01L 27/124;
(Continued)

(56) References Cited

U.S. PATENT DOCUMENTS 6,198,652 B1    3/2001  Kawakubo et al.
7,088,606 B2    8/2006  Turner
(Continued)

FOREIGN PATENT DOCUMENTS

JP    2007-115335 A    5/2007
JP    2012-256818 A    12/2012
(Continued)

OTHER PUBLICATIONS

International Search Report (Application No. PCT/IB2019/059955) dated Feb. 18, 2020.
(Continued)

*Primary Examiner* — Jerome Leboeuf
(74) *Attorney, Agent, or Firm* — NIXON PEABODY LLP; Jeffrey L. Costellia

(57) ABSTRACT

A semiconductor device includes a first transistor one of a source and a drain of which is electrically connected to a first wiring for reading data; a second transistor one of a source and a drain of which is electrically connected to a gate of the first transistor and the other of the source and the drain of which is electrically connected to a second wiring for writing the data; and a third transistor one of a source and a drain of which is electrically connected to the gate of the first transistor and the other of the source and the drain of which is electrically connected to a capacitor for retaining electric
(Continued)

charge corresponding to the data, and the third transistor includes a metal oxide in a channel formation region.

8 Claims, 23 Drawing Sheets

(51) Int. Cl.
  *H01L 27/12* (2006.01)
  *H01L 29/786* (2006.01)
  *H10B 12/00* (2023.01)

(52) U.S. Cl.
  CPC ........ *H01L 27/1225* (2013.01); *H01L 27/124* (2013.01); *H01L 27/1255* (2013.01); *H01L 29/78648* (2013.01); *H01L 29/7869* (2013.01); *H10B 12/00* (2023.02)

(58) Field of Classification Search
  CPC ........... H01L 27/1255; H01L 29/78648; H01L 29/7869; H01L 29/78696; H10B 12/00
  See application file for complete search history.

(56) References Cited

U.S. PATENT DOCUMENTS

| | | | |
|---|---|---|---|
| 8,363,452 | B2 | 1/2013 | Yamazaki et al. |
| 8,576,636 | B2 | 11/2013 | Kato et al. |
| 9,208,826 | B2 | 12/2015 | Yamauchi |
| 9,208,849 | B2 | 12/2015 | Yamamoto |
| 9,343,480 | B2 | 5/2016 | Yoneda |
| 9,721,959 | B2 | 8/2017 | Takahashi |
| 2001/0015450 | A1 | 8/2001 | Sugibayashi et al. |
| 2009/0027371 | A1 | 1/2009 | Lin et al. |
| 2009/0184315 | A1 | 7/2009 | Lee et al. |
| 2011/0089417 | A1 | 4/2011 | Yamazaki et al. |
| 2011/0101332 | A1 | 5/2011 | Yamazaki et al. |
| 2011/0101334 | A1 | 5/2011 | Yamazaki et al. |
| 2011/0101339 | A1 | 5/2011 | Yamazaki et al. |
| 2011/0101351 | A1 | 5/2011 | Yamazaki |
| 2011/0122673 | A1 | 5/2011 | Kamata et al. |
| 2011/0134683 | A1 | 6/2011 | Yamazaki et al. |
| 2011/0176357 | A1 | 7/2011 | Koyama et al. |
| 2012/0037972 | A1 | 2/2012 | Yoneda |
| 2013/0272055 | A1 | 10/2013 | Yamamoto |
| 2014/0367673 | A1 | 12/2014 | Takahashi |
| 2016/0267950 | A1* | 9/2016 | Yamamoto ............ G11C 11/24 |

FOREIGN PATENT DOCUMENTS

| | | |
|---|---|---|
| JP | 2013-235644 A | 11/2013 |
| JP | 2015-018594 A | 1/2015 |
| KR | 2012-0016580 A | 2/2012 |
| KR | 2013-0116020 A | 10/2013 |
| KR | 2014-0145547 A | 12/2014 |
| WO | WO-2013/146039 | 10/2013 |

OTHER PUBLICATIONS

Written Opinion (Application No. PCT/IB2019/059955) dated Feb. 18, 2020.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.
Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

* cited by examiner

T1

T2

T3

T4

T5

T6

I7

I8

THREE TRANSISTOR SEMICONDUCTOR DEVICE WITH METAL OXIDE CHANNEL REGION, OPERATION METHOD THEREOF, AND ELECTRONIC DEVICE

TECHNICAL FIELD

In this specification, a semiconductor device, an operation method thereof, and the like are described.

In this specification, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

BACKGROUND ART

As a semiconductor that can be used in a transistor, a metal oxide has been attracting attention. An In—Ga—Zn oxide called "IGZO" and the like is a typical multi-component metal oxide. From the researches on IGZO, a CAAC (c-axis aligned crystalline) structure and an nc (nanocrystalline) structure, which are not single crystal nor amorphous, have been found (e.g., Non-Patent Document 1).

It has been reported that a transistor including a metal oxide semiconductor in a channel formation region (hereinafter, such a transistor may be referred to as an "oxide semiconductor transistor" or an "OS transistor") has an extremely low off-state current (e.g., Non-Patent Documents 1 and 2). A variety of semiconductor devices using OS transistors have been manufactured (e.g., Non-Patent Documents 3 and 4). The manufacturing process of an OS transistor can be incorporated in a CMOS process with a conventional Si transistor, and an OS transistor can be stacked over a Si transistor (e.g., Non-Patent Document 4).

REFERENCE

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51,021201 (2012).
[Non-Patent Document 3] S. Amano et al., "Low Power LC Display Using In—Ga—Zn-Oxide TFTs Based on Variable Frame Frequency", SID Symp. Dig. Papers, vol. 41, pp. 626-629 (2010).
[Non-Patent Document 4] T. Ishizu et al., "Embedded Oxide Semiconductor Memories: A Key Enabler for Low-Power VLSI", ECS Tran., vol. 79, pp. 149-156 (2017).

SUMMARY OF THE INVENTION

Problems to be Solved by the Invention

An object of one embodiment of the present invention is to provide a semiconductor device that functions as a memory device using extremely low off-state current and has high reliability to retain data for a long time, or to provide a semiconductor device that functions as the memory device and excels in reducing power consumption.

The description of a plurality of objects does not disturb the existence of each object. One embodiment of the present invention does not necessarily achieve all the objects described as examples. Furthermore, objects other than those listed are apparent from description of this specification, and such objects can be objects of one embodiment of the present invention.

Means for Solving the Problems

One embodiment of the present invention is a semiconductor device including a first transistor one of a source and a drain of which is electrically connected to a first wiring for reading data; a second transistor one of a source and a drain of which is electrically connected to a gate of the first transistor and the other of the source and the drain of which is electrically connected to a second wiring for writing the data; and a third transistor one of a source and a drain of which is electrically connected to the gate of the first transistor and the other of the source and the drain of which is electrically connected to a capacitor for retaining electric charge corresponding to the data, in which the third transistor includes a metal oxide in a channel formation region.

In the semiconductor device of one embodiment of the present invention, the second transistor preferably includes an metal oxide in a channel formation region.

In the semiconductor device of one embodiment of the present invention, the first transistor preferably includes silicon in a channel formation region.

In the semiconductor device of one embodiment of the present invention, the first wiring and the second wiring are preferably the same wiring.

One embodiment of the present invention is an electronic device including the above semiconductor device and a housing.

One embodiment of the present invention is an operation method of the above semiconductor device, and the operation method of the semiconductor device includes data writing operation in which the second transistor and the third transistor are brought into a conduction state, data retention operation in which the third transistor is brought into a non-conduction state, and data reading operation in which the second transistor is brought into a non-conduction state and the third transistor is brought into a conduction state.

Note that other embodiments of the present invention are shown in the description of the following embodiments and the drawings.

Effect of the Invention

According to one embodiment of the present invention, a semiconductor device that functions as a memory device using extremely low off-state current and has high reliability to retain data for a long time can be provided, or a semiconductor device that functions as the memory device and excels in reducing power consumption can be provided.

The description of a plurality of effects does not disturb the existence of other effects. One embodiment of the present invention does not necessarily achieve all the effects described as examples. In one embodiment of the present invention, other objects, effects, and novel features will be apparent from the description of the specification and the drawings.

MODE FOR CARRYING OUT THE INVENTION

Figure 1A:
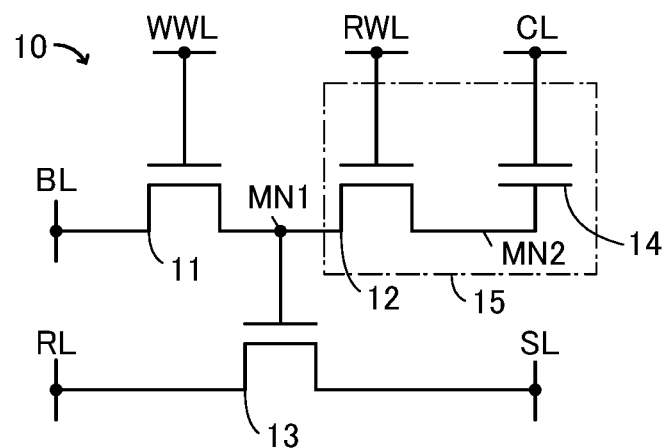
FIG. 1A and FIG. 1B are a circuit diagram illustrating a structure example of a semiconductor device and a timing chart.

Embodiments of the present invention will be described below. Note that one embodiment of the present invention is not limited to the following description, and it will be readily appreciated by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Alternatively, for example, in this specification and the like, a "first" component in one embodiment can be omitted in other embodiments or claims.

The same components, components having similar functions, components made of the same material, components formed at the same time, and the like in the drawings are denoted by the same reference numerals, and repetitive description thereof is skipped in some cases.

In this specification, a power supply potential VDD may be abbreviated to a potential VDD, VDD, or the like, for example. The same applies to other components (e.g., a signal, a voltage, a circuit, an element, an electrode, a wiring, and the like).

Moreover, when a plurality of components are denoted by the same reference numerals, and, in particular, need to be distinguished from each other, an identification sign such as "_1", "_2", "[n]", or "[m,n]" is sometimes added to the reference numerals. For example, the second wiring GL is referred to as a wiring GL[2].

Embodiment 1

Structure examples of a semiconductor device of one embodiment of the present invention and an operation method of the semiconductor device will be described with reference to FIG. 1 to FIG. 14.

FIG. 1A illustrates an example of a circuit diagram of a semiconductor device. A semiconductor device 10 illustrated in FIG. 1A includes a transistor 11, a transistor 12, a transistor 13, and a capacitor 14.

A gate of the transistor 11 is connected to a wiring WWL. One of a source and a drain of the transistor 11 is connected to a gate of the transistor 13 and one of a source and a drain of the transistor 12. The other of the source and the drain of the transistor 11 is connected to a wiring BL. In FIG. 1A and the description in this specification, a node where the one of the source and the drain of the transistor 11, the gate of the transistor 13, and the one of the source and the drain of the transistor 12 are connected is referred to as a node MN1.

A gate of the transistor 12 is connected to a wiring RWL. The other of the source and the drain of the transistor 12 is connected to one electrode of the capacitor 14. The other electrode of the capacitor 14 is connected to a wiring CL. In FIG. 1A and the description in this specification, a node where the other of the source and the drain of the transistor 12 and the one electrode of the capacitor 14 are connected is referred to as a node MN2. Note that the wiring CL is a wiring to which a fixed potential is supplied.

Note that the electrostatic capacitance value of the capacitor 14 (the capacitance value of the node MN2) is preferably larger than the gate capacitance of the transistor 13 (the capacitance value of the node MN1). In the structure of FIG. 1A, data is read from the semiconductor device through writing back of the data from the node MN2 to the node MN1. Therefore, the capacitance value of the node MN1 is made smaller than the capacitance value of the node MN2, whereby the amount of electric charge required for writing back the data can be reduced.

One of a source and a drain of the transistor 13 is connected to a wiring RL. The other of the source and the drain of the transistor 13 is connected to a wiring SL.

The transistor 12 has a function of controlling whether to transmit a voltage of the node MN1 to the node MN2 in accordance with a voltage supplied to the wiring RWL. Furthermore, the transistor 12 has a function of retaining, in the capacitor 14, a voltage supplied to the node MN2 in accordance with a voltage supplied to the wiring RWL. The transistor 12 can function as a switch whose conduction state or non-conduction state (also referred to as on or off) is switched in accordance with a voltage supplied to the wiring RWL.

As the transistor 12, a transistor including an oxide semiconductor in a channel formation region (hereinafter referred to as an OS transistor) is preferably used. In the structure of one embodiment of the present invention, with the use of a memory element including an OS transistor, a desired voltage can be retained in the memory element by utilizing extremely low leakage current flowing between a source and a drain when the transistor is off (hereinafter referred to as off-state current).

As the transistor 12, a transistor including an oxide semiconductor in a channel formation region (hereinafter referred to as an OS transistor) is preferably used. In the structure of one embodiment of the present invention, with the use of an OS transistor as the transistor 12, thanks to its extremely low leakage current which flows between a source and a drain when the transistor is in a non-conduction state (off) (hereinafter off-state current), electric charge corresponding to data written to the semiconductor device 10 can be retained in the capacitor 14. That is, the data written to the semiconductor device 10 can be retained in a charge retention circuit 15 including the transistor 12 and the capacitor 14 for a long time.

In addition, the charge retention circuit 15 using an OS transistor can rewrite and read data by charging or discharging of electric charge; thus, a substantially unlimited number of times of data writing and data reading are possible. Unlike a magnetic memory, a resistive random access memory, or the like, the charge retention circuit 15 using an OS transistor has no change in the structure at the atomic level and thus exhibits high rewrite endurance. In addition, unlike in a flash memory, unstableness due to the increase of electron trap centers is not observed in the charge retention circuit 15 using an OS transistor even when rewrite operation is repeated.

The charge retention circuit 15 using an OS transistor can be freely arranged, for example, over a circuit using a transistor including silicon in a channel formation region (hereinafter a Si transistor), so that integration can be easily performed. Furthermore, an OS transistor can be manufactured with a manufacturing apparatus similar to that for a Si transistor and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain in accordance with a voltage applied to the gate electrode or the back gate electrode. Thus, circuit design with the same ideas as those of an LSI is possible. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

As a material used for a Si transistor, single crystal silicon and non-single crystal silicon (e.g., polycrystalline silicon or the like) can be used. Use of single crystal silicon for a Si transistor can increase the current flowing between the source and the drain in an on state (also referred to as on-state current). Note that besides silicon, a semiconductor such as germanium (Ge) and a compound semiconductor such as GaAs, InP, SiC, ZnSe, GaN, or SiGe can also be used as a material for a semiconductor layer.

The transistor 11 has a function of controlling whether to transmit, to the node MN1, a voltage corresponding to data supplied to the wiring BL in accordance with a voltage supplied to the wiring WWL. The transistor 11 can function as a switch whose conduction state or non-conduction state (also referred to as on or off) is switched in accordance with a voltage supplied to the wiring WWL.

Note that in the case of using a Si transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected.

Data supplied to the wiring BL can be represented as binary data of data '1' or data '0'. Data '1' or data '0' is a signal written depending on the level of a potential. Data '1' is a potential for making current flow through the transistor 12 enough to allow data reading by charge distribution from the node MN2 to the node MN1 after being retained at the node MN2. Data '0' is a potential for preventing current from flowing through the transistor 12 in charge distribution from the node MN2 to the node MN1 after being retained at the node MN2.

The transistor 13 has a function of controlling the amount of current flowing between the source electrode and the drain electrode in accordance with the potential of the node MN1. The wiring RL is a wiring whose potential changes in accordance with the amount of current flowing through the transistor 13 after being supplied with electric charge by a precharge circuit (being precharged). The wiring SL is a wiring supplied with a potential for controlling the amount of current flowing through the transistor 13 in accordance with the potential of the node MN1.

With the structure in FIG. 1A, data rewriting and data reading become possible by charging or discharging of electric charge; thus, a substantially unlimited number of times of data writing and data reading are possible. In data reading, data can be read without discharging of retained electric charge, i.e., destructive reading; therefore, power consumption due to charging and discharging of electric charge required for data refreshing can be reduced.

Moreover, with the structure in FIG. 1A, the capacitance value of the node MN1 is smaller than the capacitance value of the node MN2; thus, the amount of electric charge required when data is written back can be reduced. Therefore, data can be read without discharging of retained electric charge to a wiring with large electrostatic capacitance, or the like. In addition, when the capacitance value of the node MN2 is large, a highly reliable semiconductor device that retains data for a long time can be obtained.

Figure 1B:
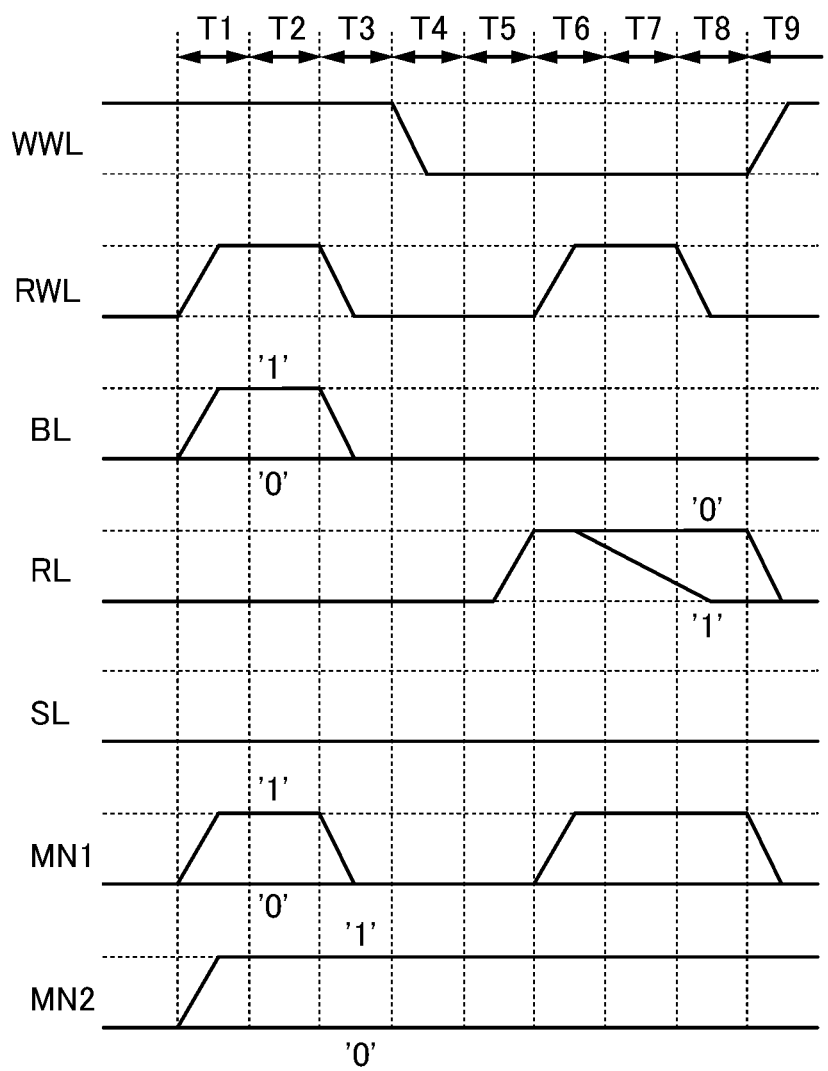

FIG. 1B is a timing chart for describing an operation example of the semiconductor device in FIG. 1A. FIG. 1B schematically shows changes in the potentials of the wiring WWL, the wiring RWL, the wiring BL, the wiring RL, the wiring SL, the node MN1, and the node MN2 due to data writing and data reading. In FIG. 1B, separate periods T1 to T9 are shown, and the periods T1 to T3 each correspond to a data writing period, the period T4 corresponds to a data retention period, and the period T5 to the period T9 each correspond to a data reading period. In FIG. 1B, data is shown as a signal of '1' or '0'. For an operation example of the semiconductor device 10, the description is made on the assumption that a potential of a wiring supplied with a signal that controls a conduction state or a non-conduction state of a transistor is an H-level potential or an L-level potential FIG. 2 to FIG. 6 are diagrams for schematically showing operation of the semiconductor device 10 in the periods T1 to T9 in FIG. 1B. Note that in FIG. 2 to FIG. 6, a solid line arrow schematically denotes a flow of a signal input and output between wirings or nodes. In the circuit diagrams of FIG. 2 to FIG. 6, transistors in a non-conduction state are marked with a cross for easy understanding.

Figure 2A:
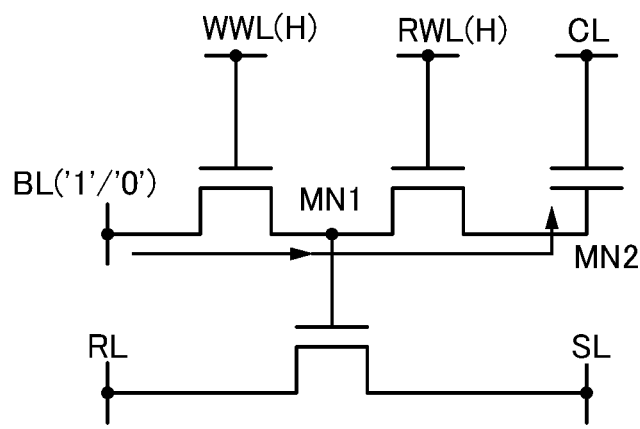
FIG. 2A and FIG. 2B are circuit diagrams illustrating a structure example of a semiconductor device.

The period T1 in FIG. 1B is a period during which data writing operation is performed. As illustrated in FIG. 2A, the wiring WWL is set at an H level and the wiring RWL is set at an H level, whereby the transistor 11 and the transistor 12 are brought into a conduction state. A potential corresponding to data '1' or '0' is supplied to the wiring BL, and the potential is supplied to the node MN1 and the node MN2. The wiring RL and the wiring SL are set at the same potential, and thus current does not flow through the transistor 13.

Figure 2B:
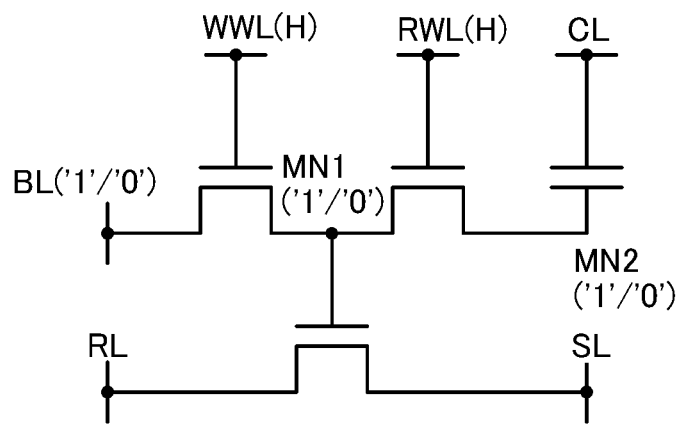

The period T2 in FIG. 1B is a period during which data writing operation is performed. As illustrated in FIG. 2B, each of the potentials of the node MN1 and the node MN2 becomes the potential corresponding to data '1' or '0'.

Figure 3A:
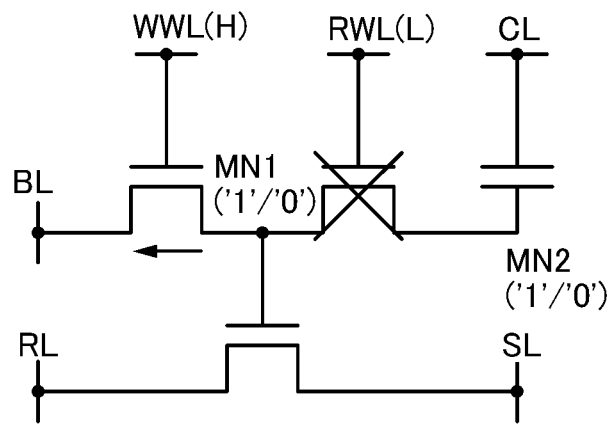
FIG. 3A and FIG. 3B are circuit diagrams illustrating a structure example of a semiconductor device.

The period T3 in FIG. 1B is a period during which data writing operation is performed. As illustrated in FIG. 3A, the wiring WWL is set at an H level and the wiring RWL is set at an L level, whereby the transistor 11 is brought into a conduction state and the transistor 12 is brought into a non-conduction state. The potential corresponding to data '1' or '0' is retained at the node MN2. The potential corresponding to data '1' or '0' at the node MN1 is discharged to the wiring BL and then the potential of the node MN1 becomes an L-level potential.

Figure 3B:
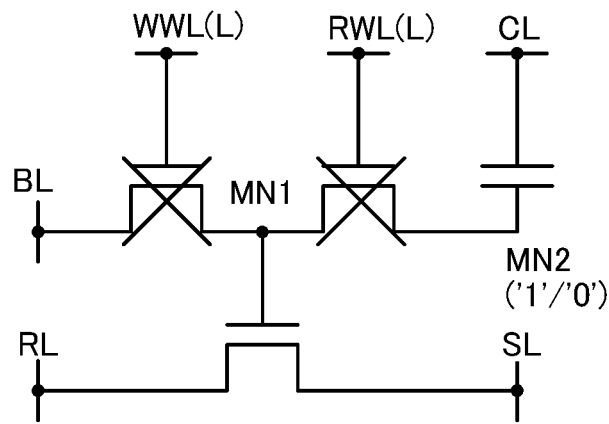

The period T4 in FIG. 1B is a period during which data retention is performed. As illustrated in FIG. 3B, the wiring WWL is set at an L level and the wiring RWL is set at an L level, whereby the transistor 11 is brought into a non-conduction state and the transistor 12 is brought into a non-conduction state. The potential corresponding to data '1' or '0' is retained at the node MN2. The potential in the period T3, that is, an L-level potential is retained at the node MN1. The potential of the node MN2 can be less likely to be discharged to the wiring BL by bringing both the transistor 11 and the transistor 12 into a non-conduction state.

Figure 4A:
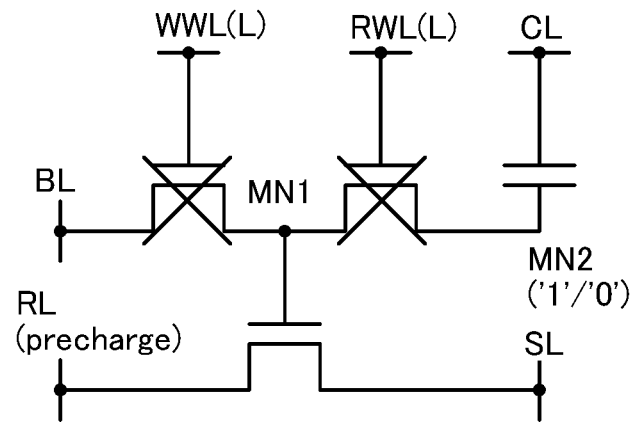
FIG. 4A and FIG. 4B are circuit diagrams illustrating a structure example of a semiconductor device.

The period T5 in FIG. 1B is a period during which data reading operation is performed. As illustrated in FIG. 4A, the wiring WWL is set at an L level and the wiring RWL is set at an L level, whereby the transistor 11 is brought into a non-conduction state and the transistor 12 is brought into a non-conduction state. The wiring RL is precharged at a predetermined potential, e.g., an H-level potential (denoted by "precharge" in the diagram).

Figure 4B:
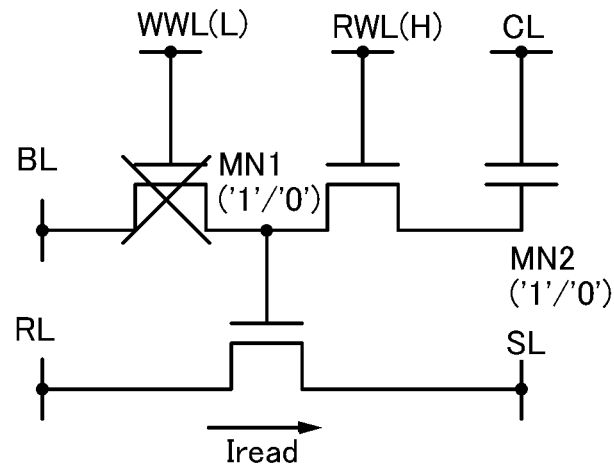

The period T6 in FIG. 1B is a period during which data reading operation is performed. As illustrated in FIG. 4B, the wiring WWL is set at an L level and the wiring RWL is set at an H level, whereby the transistor 11 is brought into a non-conduction state and the transistor 12 is brought into a conduction state. Electric charge retained at the node MN2 is distributed to the node MN1, and each of the potentials of the node MN1 and the node MN2 becomes the potential corresponding to data '1' or '0'. The capacitance value of the node MN1 is smaller than the capacitance value of the node MN2; thus, a change in potential due to the distribution of electric charge can be made small. Current Tread flows through the transistor 13 in accordance with the potential of the node MN1, i.e., data '1' or '0' retained in the charge retention circuit 15. The current Tread is high when the potential of the node MN1 is at an H level, that is, data '1', and low when the potential of the node MN1 is at an L level, that is, data '0'. Therefore, in the case of data '1', a change in potential of the precharged wiring RL becomes large, and in the case of data '0', a change in potential of the precharged wiring RL becomes small. The potential of the wiring RL precharged in the period T5 changes in accordance with the magnitude of the current Tread.

Figure 5A:
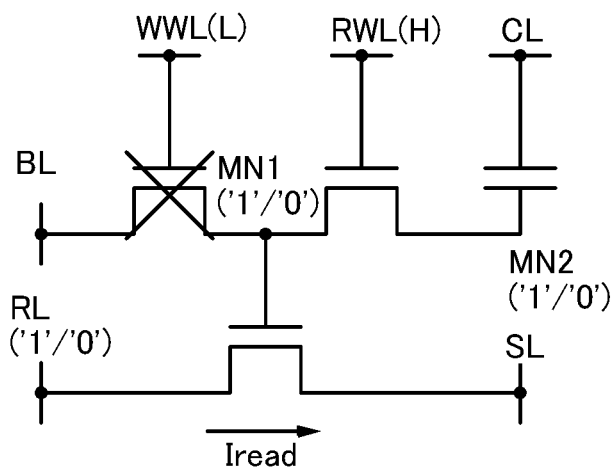
FIG. 5A and FIG. 5B are circuit diagrams illustrating a structure example of a semiconductor device.

The period T7 in FIG. 1B is a period during which data reading operation is performed. As illustrated in FIG. 5A, the current Tread flows through the transistor 13 in accordance with the potential of the node MN1. When data of the node MN1 is data '1', that is, an H-level potential, the current Tread is high. Accordingly, a change in potential of the precharged wiring RL is large. In contrast, when data of the node MN1 is data '0', that is, an L-level potential, the current Tread is low (the wiring RL is changed to an L level). Accordingly, a change in potential of the precharged wiring RL is small (the wiring RL remains an H level). Thus, data written to the semiconductor device 10 can be read to the wiring RL.

Figure 5B:
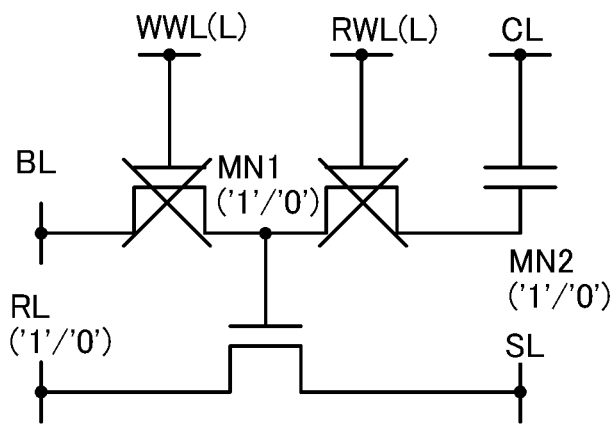

The period T8 in FIG. 1B is a period during which data reading operation is performed. As illustrated in FIG. 5B, the wiring WWL is set at an L level and the wiring RWL is set at an L level, whereby the transistor 11 is brought into a non-conduction state and the transistor 12 is brought into a non-conduction state. Each of the potentials of the node MN1 and the node MN2 becomes the potential corresponding to data '1' or '0'.

Figure 6:
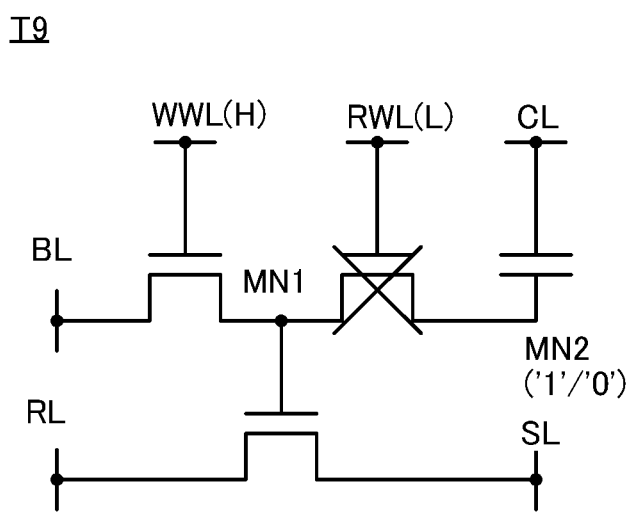
FIG. 6 is a circuit diagram illustrating a structure example of a semiconductor device.

The period T9 in FIG. 1B is a period during which data reading operation is performed. As illustrated in FIG. 6, the wiring WWL is set at an H level and the wiring RWL is set at an L level, whereby the transistor 11 is brought into a conduction state and the transistor 12 is brought into a non-conduction state. The potential corresponding to data '1' or '0' is retained at the node MN2. The potential corresponding to data '1' or '0' at the node MN1 is discharged to the wiring BL. The potential of the node MN1 becomes the potential of the wiring BL, that is, an L-level potential. The current Tread does not flow through the transistor 13.

By employing the operation method of FIG. 1B and FIG. 2 to FIG. 6 in the structure in FIG. 1A, data rewriting and data reading become possible by charging or discharging of electric charge; thus, a substantially unlimited number of times of data writing and data reading are possible. In data reading, data can be read without discharging of retained electric charge, i.e., destructive reading; therefore, power consumption due to charging and discharging of electric charge required for data refreshing can be reduced.

By employing the operation method of FIG. 1B and FIG. 2 to FIG. 6 in the structure in FIG. 1A, the amount of electric charge required when data is written back can be reduced because the capacitance value of the node MN1 is smaller than the capacitance value of the node MN2. Therefore, data can be read without discharging of retained electric charge to a wiring with large electrostatic capacitance, or the like. In addition, when the capacitance value of the node MN2 is large, a highly reliable semiconductor device that retains data for a long time can be obtained.

Figure 7A:
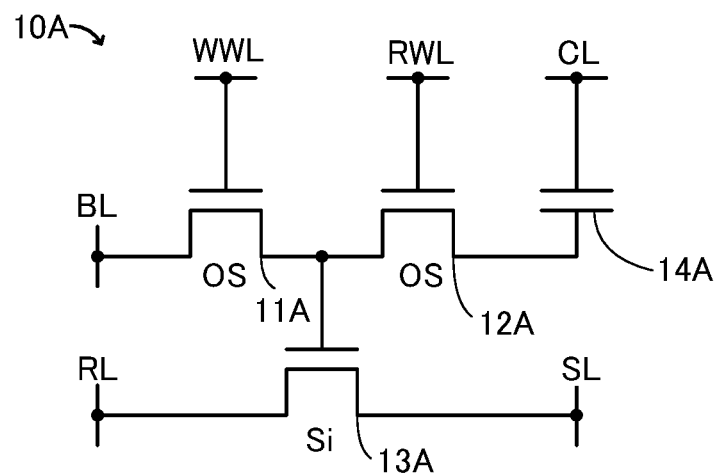
FIG. 7A and FIG. 7B are circuit diagrams illustrating structure examples of a semiconductor device

Note that the transistor 11 can be an OS transistor like the transistor 12. An OS transistor can freely be placed over a circuit using a Si transistor or the like, which facilitates integration. Furthermore, an OS transistor can be manufactured with a manufacturing apparatus similar to that for a Si transistor and thus can be manufactured at low cost. In FIG. 7A, a sign "OS" is written beside a transistor 11A and a transistor 12A included in a semiconductor device 10A in order to indicate that they are OS transistors. Furthermore, a sign "Si" is written beside a transistor 13A in order to indicate that it is a Si transistor.

Figure 7B:
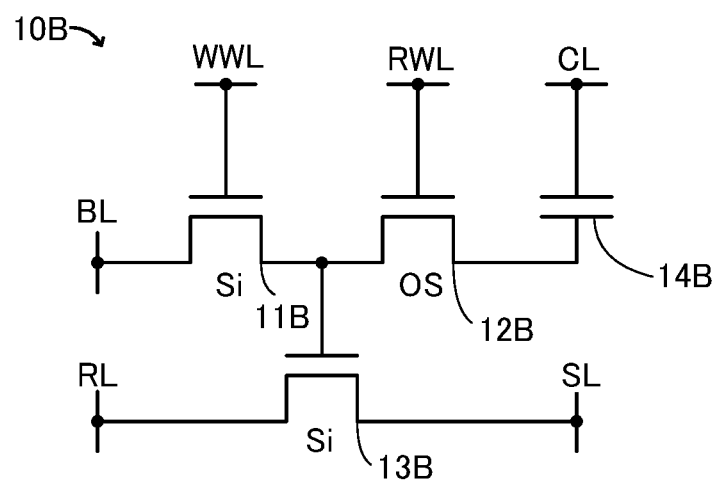

Note that the transistor 11 can be a Si transistor like the transistor 13. In FIG. 7B, a sign "OS" is written beside a transistor 12B included in a semiconductor device 10B in order to indicate that it is an OS transistor. Furthermore, a sign "Si" is written beside a transistor 11B and a transistor 13B in order to indicate that they are Si transistors.

The transistors 11A and 12A included in the semiconductor device 10A in FIG. 7A each have a top-gate structure or a bottom-gate structure without a back gate electrode; however, the structures of the transistors 11A and 12A are not limited thereto. For example, as in a semiconductor device 10C illustrated in FIG. 8A, a transistor 11C and a transistor 12C each including a back gate electrode connected to a back gate electrode line BGL may be used. A transistor 13C is a Si transistor. With the structure in FIG. 8A, electrical characteristics such as the threshold voltages of the transistor 11C and the transistor 12C can be easily controlled from the outside.

Figure 8A:
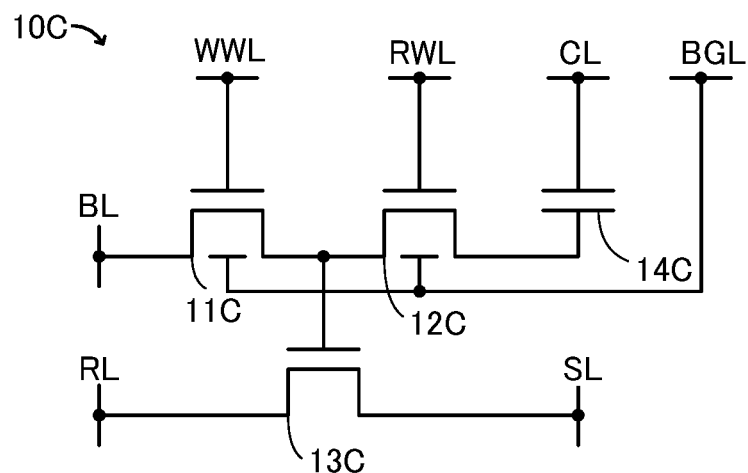
FIG. 8A and FIG. 8B are circuit diagrams illustrating structure examples of a semiconductor device.
Figure 8B:
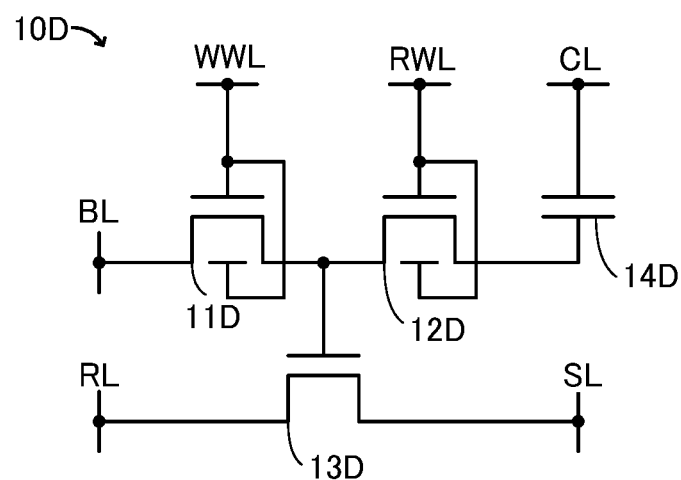
Figure 9A:
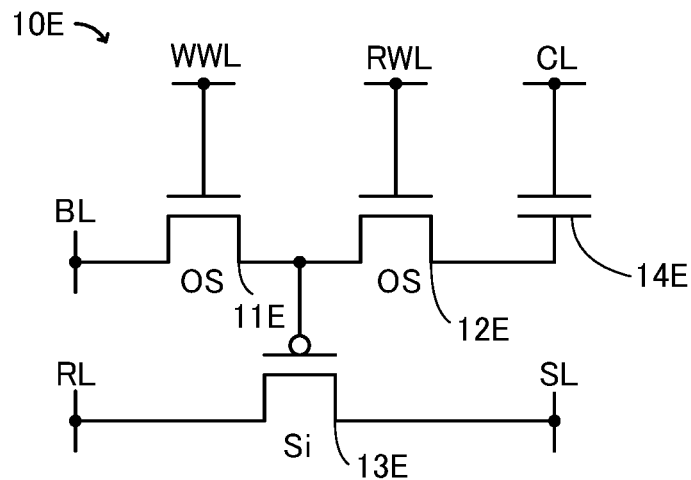
FIG. 9A, FIG. 9B, and FIG. 9C are circuit diagrams illustrating structure examples of a semiconductor device
Figure 9B:
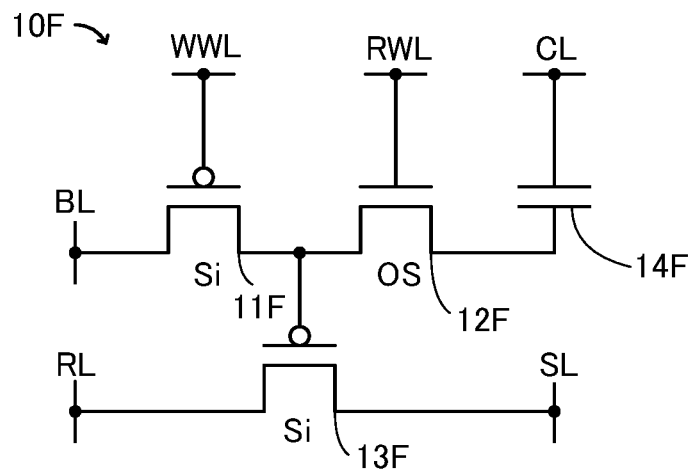
Figure 9C:
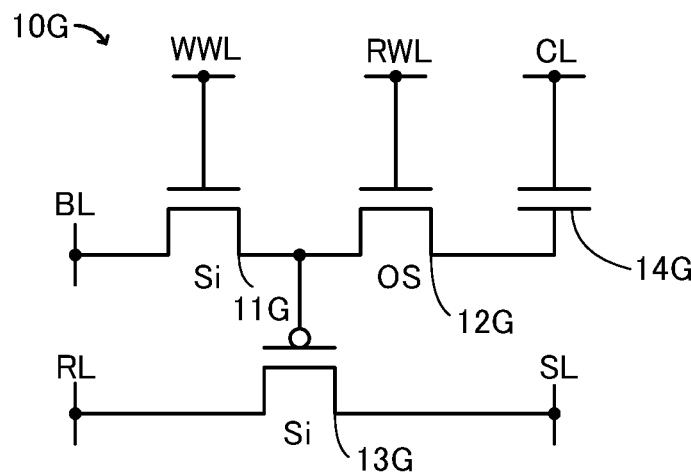

Alternatively, as in a semiconductor device 10D illustrated in FIG. 8B, a transistor 11D and a transistor 12D each including a back gate electrode connected to a gate electrode may be used. A transistor 13D is a Si transistor. With the structure in FIG. 8B, the amount of current flowing through the transistor 11D and the transistor 12D can be increased.

In FIG. 7A, the transistor 13A included in the semiconductor device 10A is an n-channel transistor; however, the conductivity type of the transistor 13A is not limited thereto. For example, a p-channel transistor 13E can be used as in a semiconductor device 10E illustrated in FIG. 9A. A transistor 11E and a transistor 12E are n-channel OS transistors.

In FIG. 7B, the transistor 11B and the transistor 13B included in the semiconductor device 10B are n-channel transistors; however, the conductivity types of the transistor 11B and the transistor 13B are not limited thereto. For example, p-channel transistors 11F and 13F can be used as in a semiconductor device 10F illustrated in FIG. 9B. A transistor 12F is an n-channel OS transistor.

In FIG. 7B, the transistor 11B and the transistor 13B included in the semiconductor device 10B are transistors having the same conductivity type but may have different conductivity types. For example, an n-channel transistor 11G and a p-channel transistor 13G can be used as in a semiconductor device 10G illustrated in FIG. 9C. A transistor 12G is an n-channel OS transistor.

Figure 10:
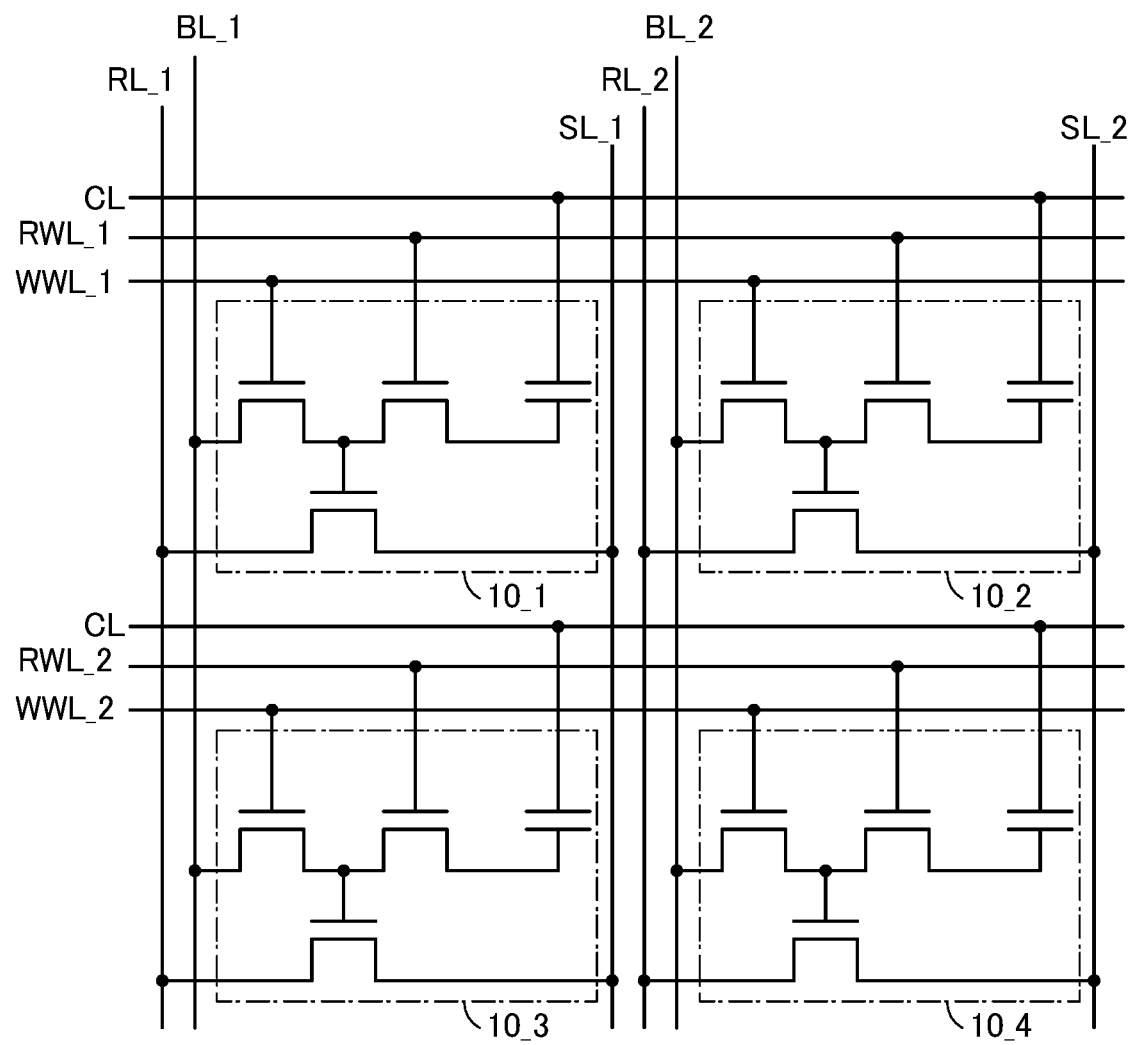
FIG. 10 is a circuit diagram illustrating a structure example of a semiconductor device.

Note that the semiconductor devices 10 can be arranged in a matrix. FIG. 10 illustrates a structure example in which the semiconductor devices 10 in FIG. 1A are arranged in a matrix of two rows and two columns. In FIG. 10, the semiconductor devices 10 are illustrated as semiconductor devices 10_1 to 10_4. Moreover, FIG. 10 illustrates wirings RWL_1 and RWL_2, wirings WWL_1 and WWL_2, wirings RL_1 and RL_2, wirings BL_1 and BL_2, and wirings SL_1 and SL_2 as wirings connected to the semiconductor devices 10_1 to 10_4.

Figure 11:
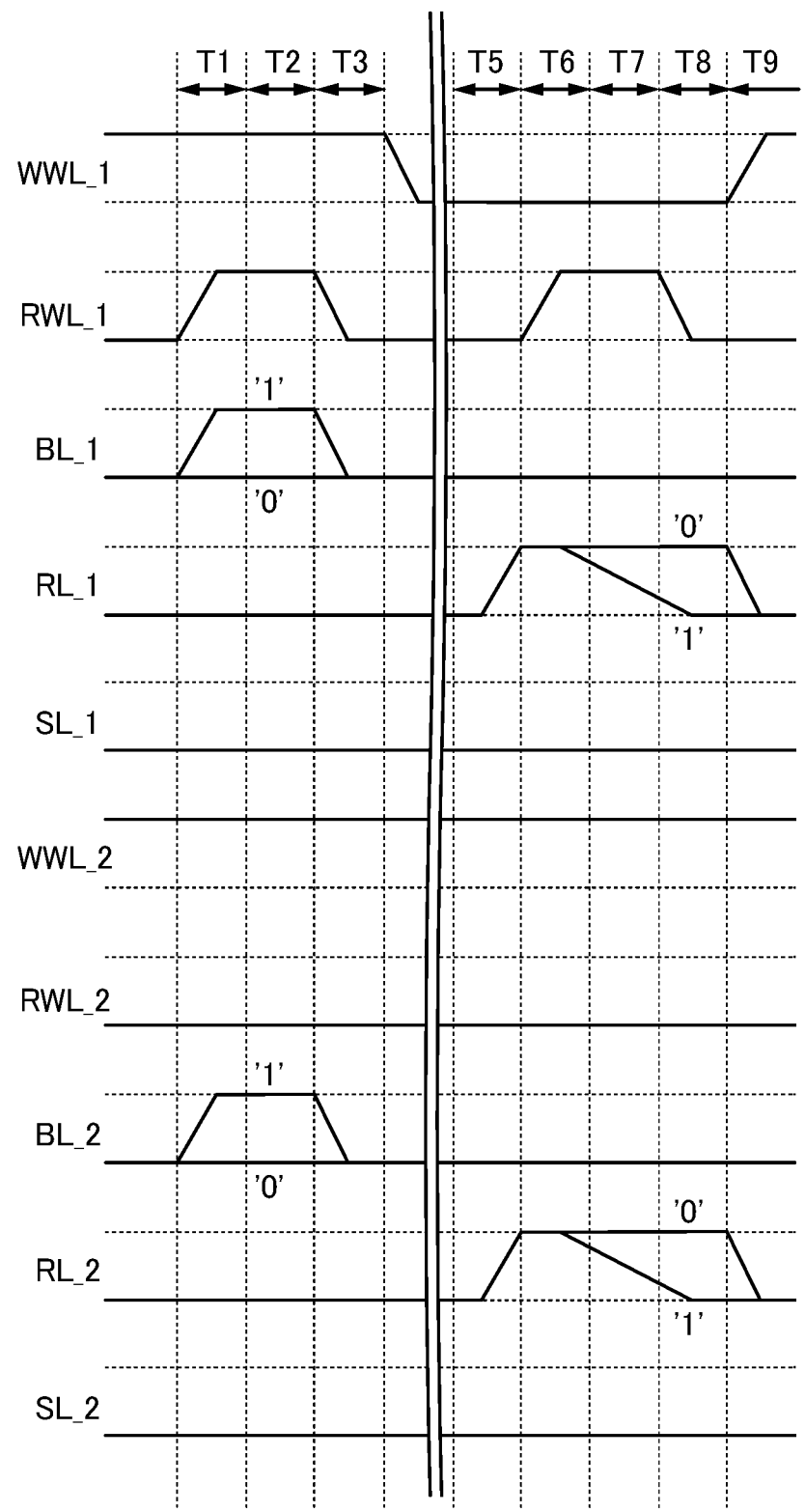
FIG. 11 is a timing chart showing an operation example of a semiconductor device.

FIG. 11 shows a timing chart for describing an example of operation with the structure illustrated in FIG. 10. The details of the timing chart shown in FIG. 11 overlap with those in FIG. 1B; therefore, the description thereof is omitted.

Figure 12:
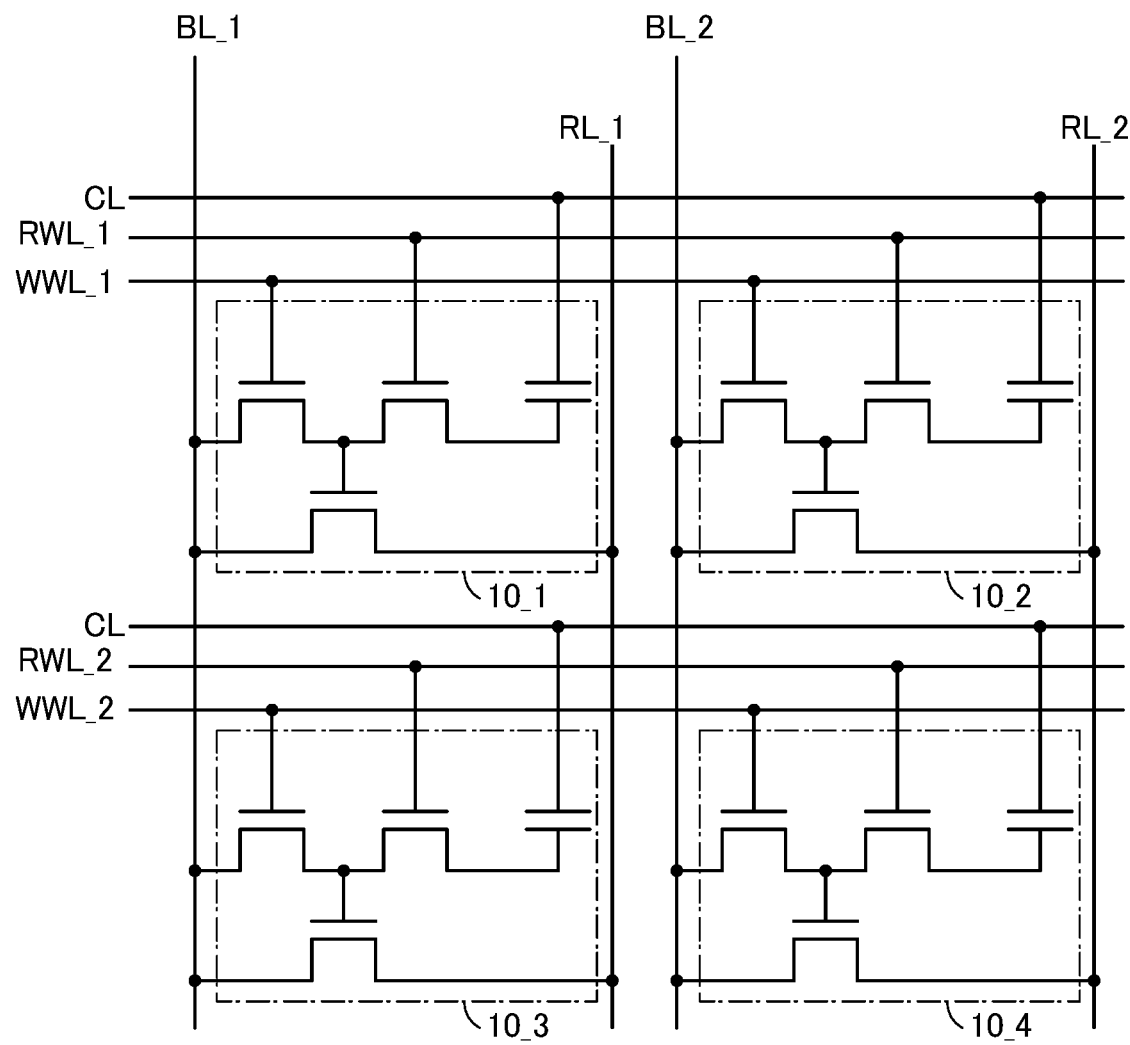
FIG. 12 is a circuit diagram illustrating a structure example of a semiconductor device.

Note that in the structure in FIG. 10, the functions of different wirings are shared, whereby the number of wirings can be reduced. FIG. 12 illustrates a structure example in which the wirings SL_1 and SL_2 are omitted with the wirings RL_1 and RL_2 operating to have the functions of the wiring RL_1 and RL_2 and the wirings SL_1 and SL_2. In other words, the wiring RL is operated as the same wiring as the wiring SL, whereby the number of wirings can be reduced.

Figure 13:
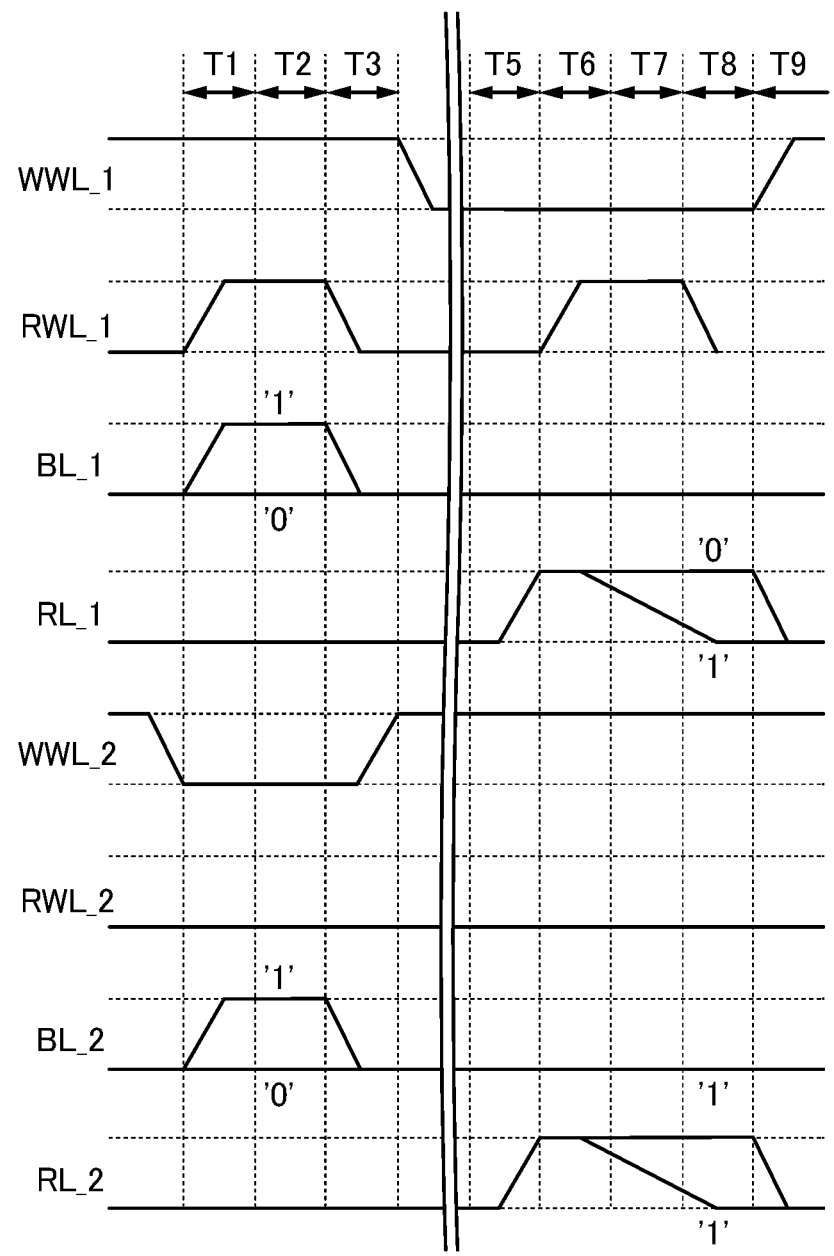
FIG. 13 is a timing chart showing an operation example of a semiconductor device.

FIG. 13 shows a timing chart for describing an example of operation with the structure illustrated in FIG. 12. Note that the timing chart shown in FIG. 13 differs from the timing chart shown in FIG. 11 in that at the time of data writing operation to the semiconductor device in a first row, the wiring WWL_2 in another row, e.g., in a second row, is set at an L level. With the structure, current flowing through the transistor 13 can be reduced in data writing. Note that the details of the other periods in the timing chart overlap with those in FIG. 1B; therefore, the description thereof is omitted.

Figure 14:
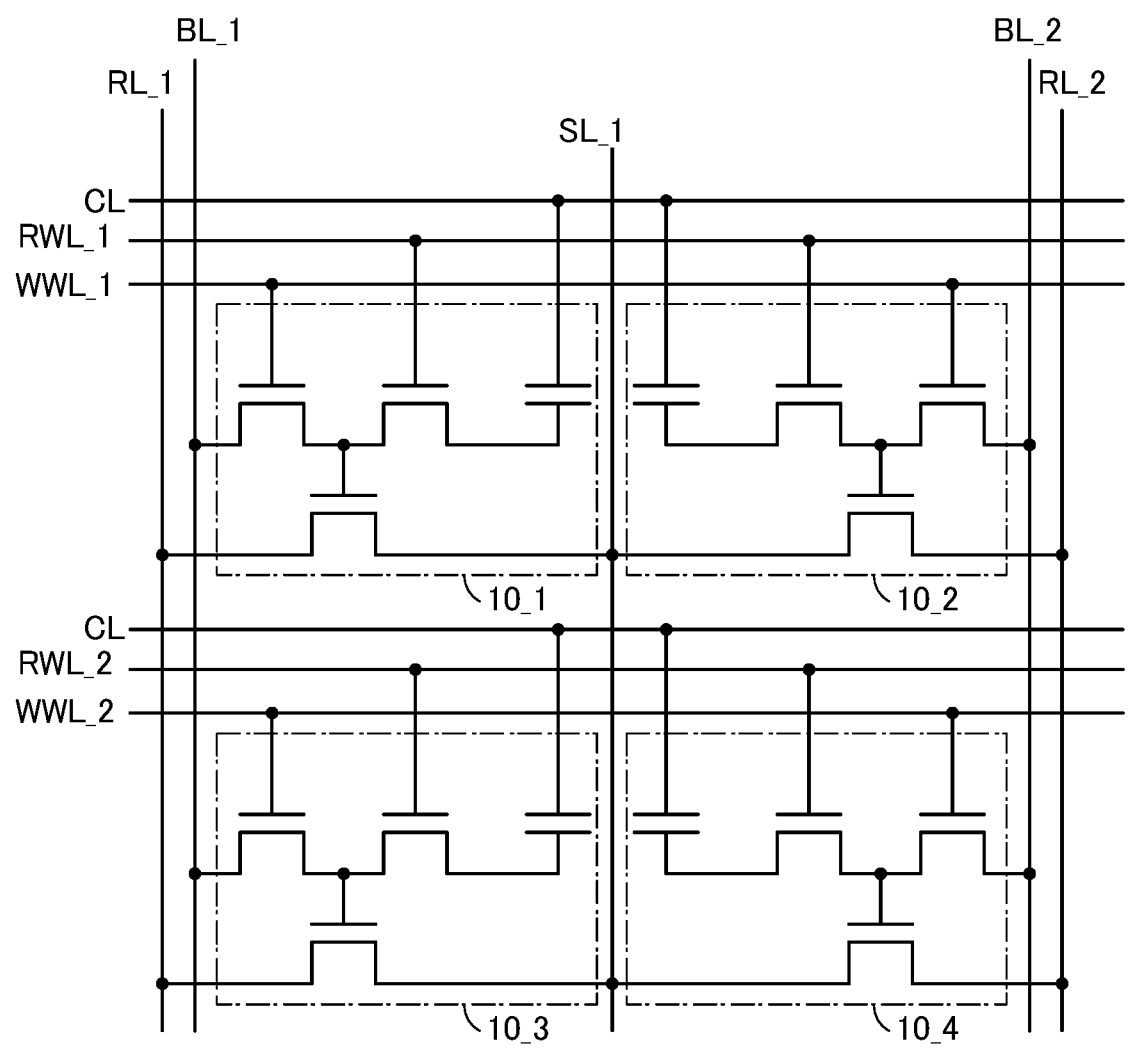
FIG. 14 is a circuit diagram illustrating a structure example of a semiconductor device.

As a different example from that in FIG. 12, FIG. 14 illustrates a structure example in which the wiring SL_2 is omitted with the wiring SL_1 operating to have the functions of the wirings SL_1 and SL_2 in FIG. 10. That is, the wiring SL is shared between a plurality of semiconductor devices, whereby the number of wirings can be reduced.

With the structures described above in Embodiment, data rewriting and data reading become possible by charging or discharging of electric charge; thus, a substantially unlimited number of times of data writing and data reading are possible. In data reading, data can be read without discharging of retained electric charge, i.e., destructive reading; therefore, power consumption due to charging and discharging of electric charge required for data refreshing can be reduced.

Moreover, with the structures described above in Embodiment, the capacitance value of the node MN1 is smaller than the capacitance value of the node MN2; thus, the amount of electric charge required when data is written back can be reduced. Therefore, data can be read without discharging of retained electric charge to a wiring with large electrostatic capacitance, or the like. In addition, when the capacitance value of the node MN2 is large, a highly reliable semiconductor device that retains data for a long time can be obtained.

Embodiment 2

In this embodiment, examples of cross-sectional structures of the semiconductor devices described in the above embodiment will be described with reference to drawings.

Figure 15:
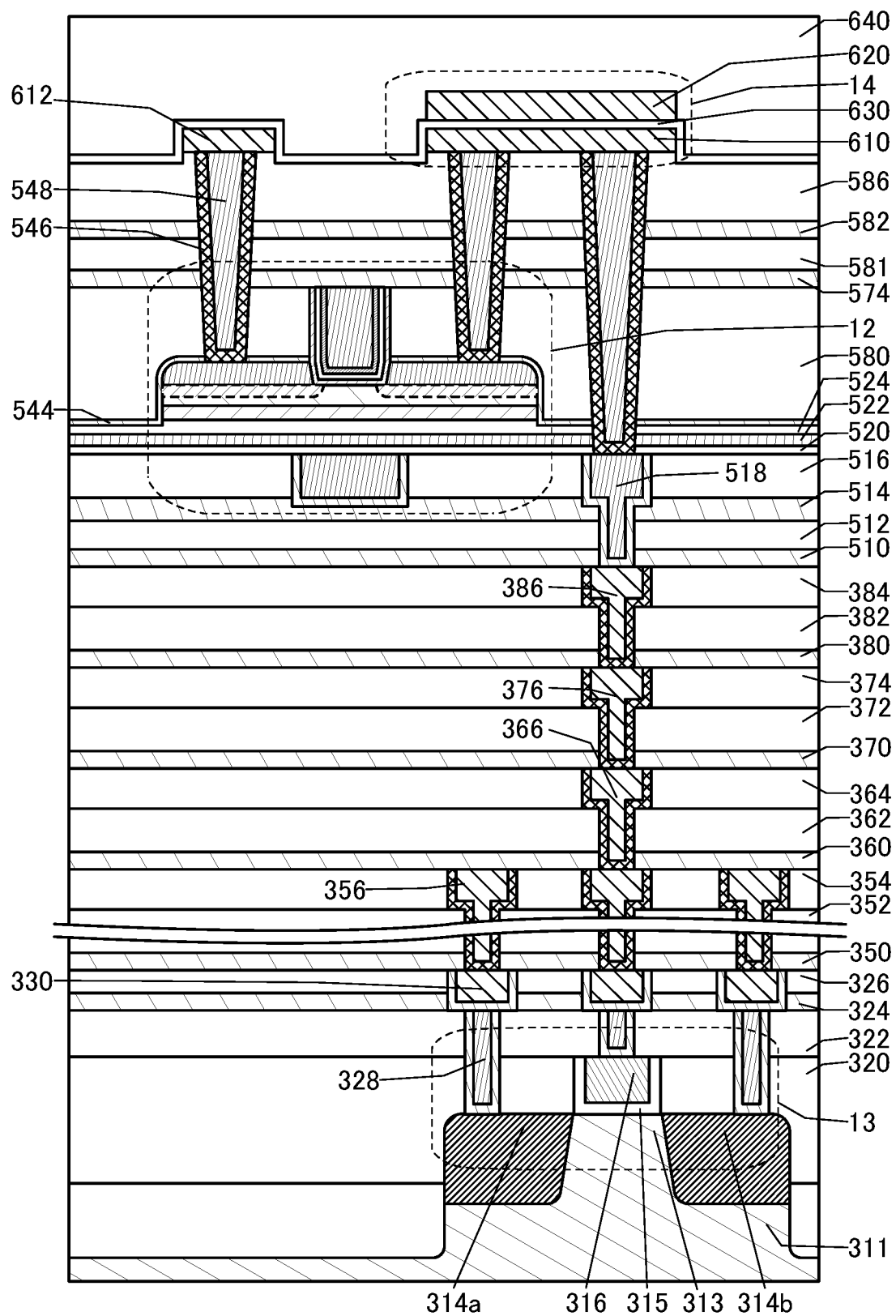
FIG. 15 is a schematic cross-sectional view illustrating a structure example of a semiconductor device.
Figure 17A:
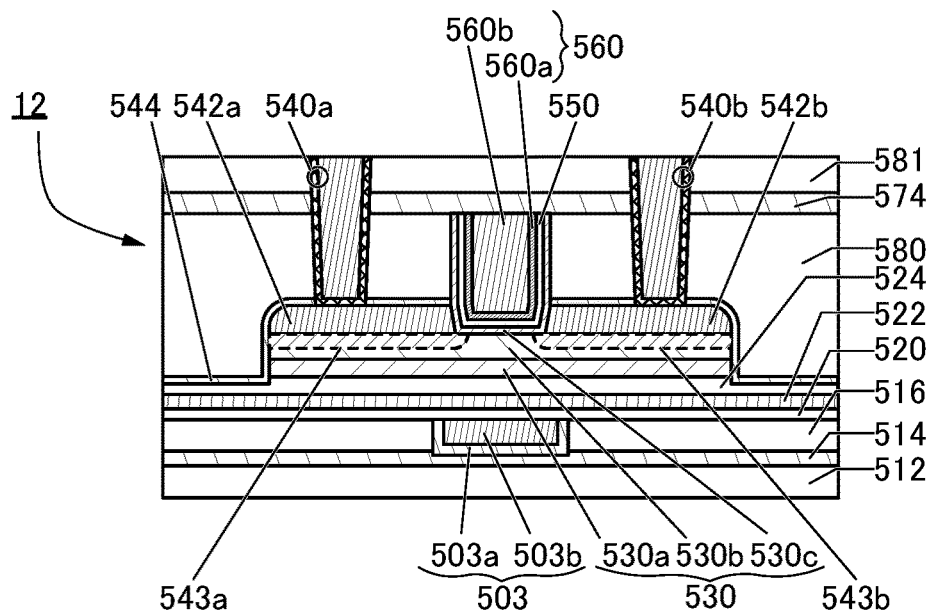
FIG. 17A, FIG. 17B, and FIG. 17C are schematic cross-sectional views illustrating structure examples of transistors.
Figure 17B:
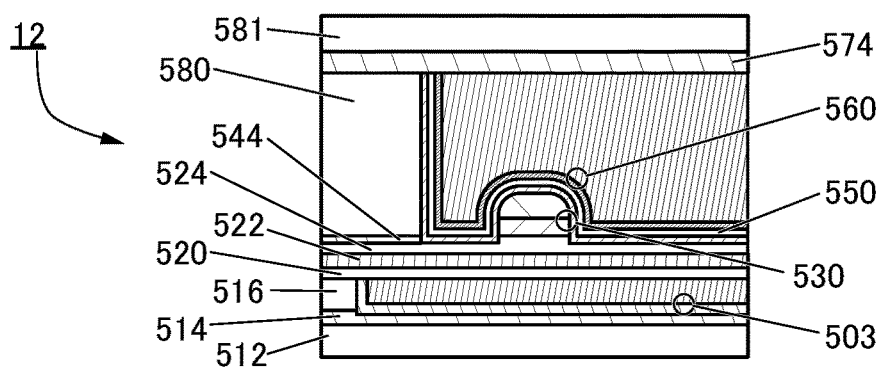
Figure 17C:
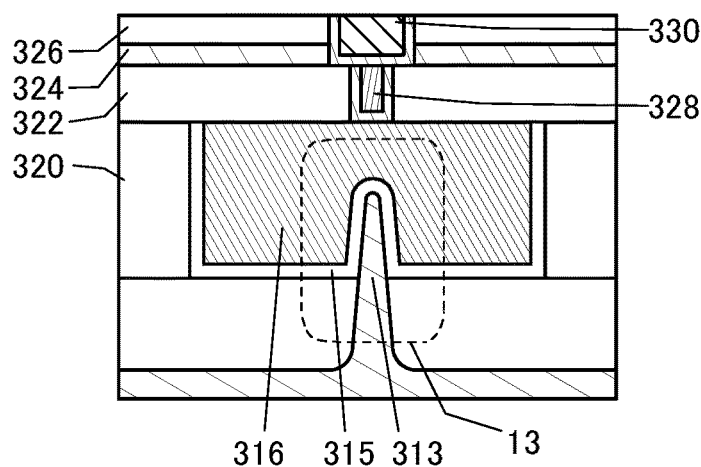

A semiconductor device illustrated in FIG. 15 includes the transistor 13, the transistor 12, and the capacitor 14. FIG. 17A is a cross-sectional view of the transistor 12 in the channel length direction, FIG. 17B is a cross-sectional view of the transistor 12 in the channel width direction, and FIG. 17C is a cross-sectional view of the transistor 13 in the channel width direction.

The transistor 12 is an OS transistor. The transistor 12 has low off-state current. Therefore, the power consumption of the semiconductor device can be reduced.

The semiconductor device described in this embodiment includes the transistor 13, the transistor 12, and the capacitor 14 as illustrated in FIG. 15. The transistor 12 is provided above the transistor 13, and the capacitor 14 is provided above the transistor 13 and the transistor 12.

The transistor 13 is provided over a substrate 311 and includes a conductor 316, an insulator 315, a semiconductor region 313 that is part of the substrate 311, and a low-resistance region 314a and a low-resistance region 314b each functioning as a source region or a drain region.

In the transistor 13, the top surface and the side surface in the channel width direction of the semiconductor region 313 are covered with the conductor 316 with the insulator 315 therebetween, as illustrated in FIG. 17C. Such a Fin-type transistor 13 has an increased effective channel width. Thus, the on-state characteristics of the transistor 13 can be improved. In addition, contribution of the electric field of the gate electrode can be increased, so that the off-state characteristics of the transistor 13 can be improved.

Note that the transistor 13 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 13 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of the conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 16:
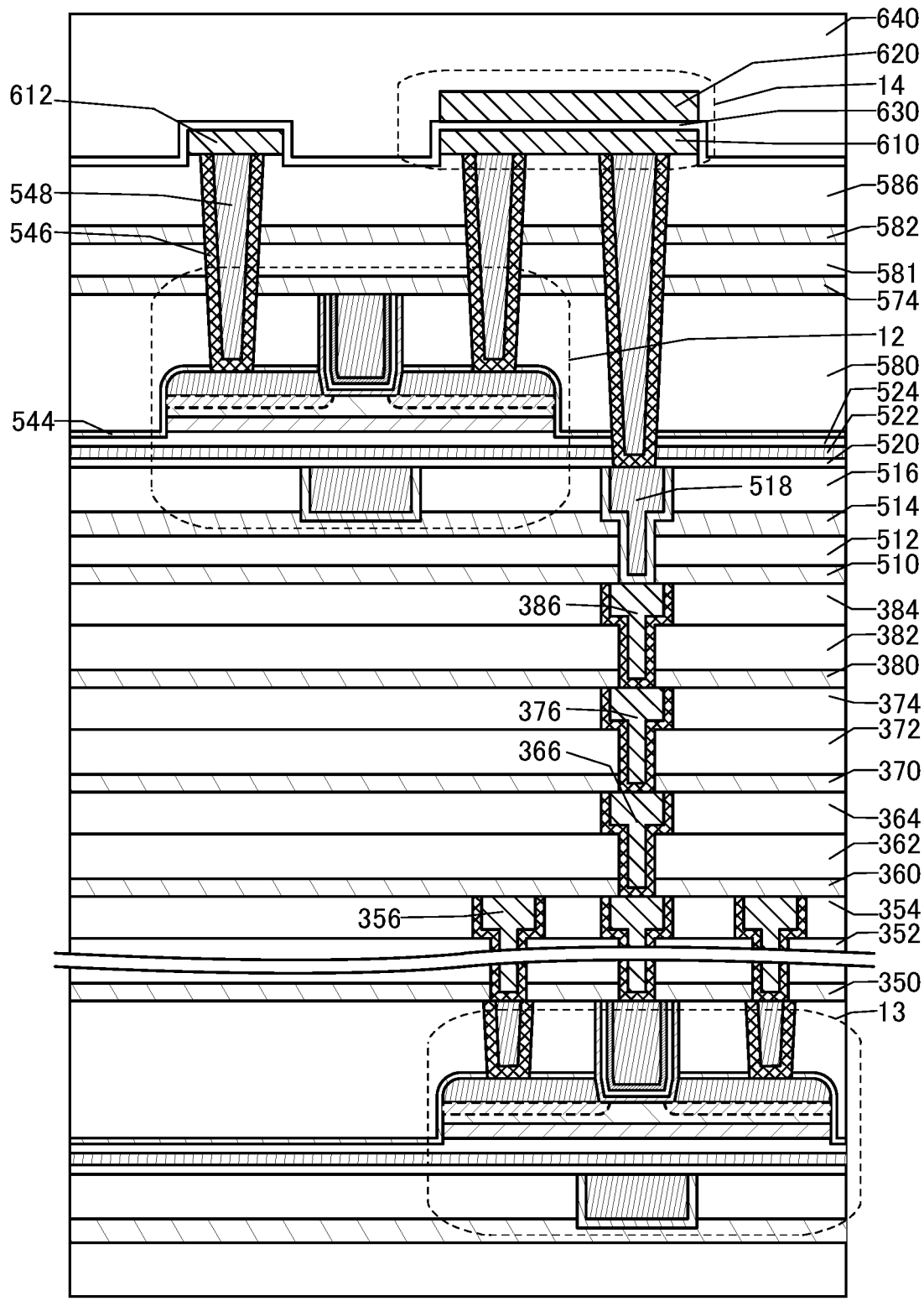
FIG. 16 is a schematic cross-sectional view illustrating a structure example of a semiconductor device.

Note that the transistor 13 illustrated in FIG. 15 is just an example and the structure is not limited thereto; an appropriate transistor can be used in accordance with a circuit structure or a driving method. For example, when the semiconductor device is a single-polarity circuit that is composed of only OS transistors, the transistor 13 has a structure similar to that of the transistor 12 which is an OS transistor, as illustrated in FIG. 16. Note that the details of the transistor 12 are described later.

In this specification and the like, a single-polarity circuit refers to a circuit in which all transistors have the same polarity, for example. For example, a circuit in which all transistors are n-channel transistors can be referred to as a single-polarity circuit.

An insulator 320, an insulator 322, an insulator 324, and an insulator 326 are provided to be stacked in this order to cover the transistor 13.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification and the like, silicon oxynitride refers to a material that contains oxygen at a higher proportion than nitrogen, and silicon nitride oxide refers to a material that contains nitrogen at a higher proportion than oxygen. Furthermore, in this specification and the like, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 13 or the like provided below the insulator 322. For example, the top surface of the insulator 322 may be planarized by planarization treatment using a chemical mechanical polishing (CMP) method or the like to improve planarity.

It is preferable to use, for the insulator 324, a film having a barrier property that prevents diffusion of hydrogen and impurities from the substrate 311, the transistor 13, or the like into a region where the transistor 12 is provided.

For the film having a barrier property against hydrogen, silicon nitride formed by a CVD method can be used, for example. Here, the diffusion of hydrogen to a semiconductor element including an oxide semiconductor, such as the transistor 12, degrades the characteristics of the semiconductor element in some cases. Therefore, a film that inhibits hydrogen diffusion is preferably provided between the transistor 12 and the transistor 13. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, a conductor 328, a conductor 330, and the like that are connected to the capacitor 14 or the transistor 12 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, it is preferable to be formed with a low-resistance conductive material such as aluminum or copper. The use of a low-resistance conductive material can reduce wiring resistance.

A wiring layer may be provided over the insulator 326 and the conductor 330. For example, in FIG. 15, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 13. Note that the conductor 356 can be provided using a material similar to that for the conductor 328 or the conductor 330.

For example, like the insulator 324, the insulator 350 is preferably formed using an insulator having a bather property against hydrogen. The conductor 356 preferably contains a conductor having a bather property against hydrogen. In particular, the conductor having a bather property against hydrogen is formed in an opening portion provided in the insulator 350 having a barrier property against hydrogen. In such a structure, the transistor 13 and the transistor 12 can be separated by a barrier layer, so that the diffusion of hydrogen from the transistor 13 into the transistor 12 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 13 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 15, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to that for the conductor 328 or the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion provided in the insulator 360 having a barrier property against hydrogen. In such a structure, the transistor 13 and the transistor 12 can be separated by a barrier layer, so that the diffusion of hydrogen from the transistor 13 into the transistor 12 can be inhibited.

A wiring layer may be provided over the insulator 364 and the conductor 366. For example, in FIG. 15, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to that for the conductor 328 or the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion provided in the insulator 370 having a barrier property against hydrogen. In such a structure, the transistor 13 and the transistor 12 can be separated by a barrier layer, so that the diffusion of hydrogen from the transistor 13 into the transistor 12 can be inhibited.

A wiring layer may be provided over the insulator 374 and the conductor 376. For example, in FIG. 15, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to that for the conductor 328 or the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion provided in the insulator 380 having a barrier property against hydrogen. In such a structure, the transistor 13 and the transistor 12 can be separated by a barrier layer, so that the diffusion of hydrogen from the transistor 13 into the transistor 12 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A material having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311 or the like, or a region where the transistor 13 is provided, or the like into the region where the transistor 12 is provided. Thus, it is preferable to use a material similar to that for the insulator 324.

For the film having a barrier property against hydrogen, silicon nitride formed by a CVD method can be used, for example. Here, the diffusion of hydrogen to a semiconductor element including an oxide semiconductor, such as the transistor 12, degrades the characteristics of the semiconductor element in some cases. Therefore, a film that inhibits hydrogen diffusion is preferably provided between the transistor 12 and the transistor 13. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent entry of impurities such as hydrogen and moisture into the transistor 12 in a manufacturing process and after manufacturing of the transistor. In addition, release of oxygen from the metal oxide included in the transistor 12 can be inhibited. Therefore, aluminum oxide is suitably used for a protective film of the transistor 12.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 12 (a conductor 503 for example), and the like are embedded in the insulator 510, the insulator 512, the insulator 514, and the insulator 516. The conductor 518 has a function of a plug or a wiring that is connected to the capacitor 14 or the transistor 13. The conductor 518 can be provided using a material similar to that for the conductor 328 or the conductor 330.

In particular, the conductor 518 in a region in contact with the insulator 510 and the insulator 514 is preferably a conductor having a barrier property against oxygen, hydrogen, and water. In such a structure, the transistor 13 and the transistor 12 can be separated by a layer having a bather property against oxygen, hydrogen, and water; thus, the diffusion of hydrogen from the transistor 13 into the transistor 12 can be inhibited.

The transistor 12 is provided above the insulator 516.

As illustrated in FIG. 17A and FIG. 17B, the transistor 12 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on a formation surface of the oxide 530c, and a conductor 560 positioned on a formation surface of the insulator 550.

As illustrated in FIG. 17A and FIG. 17B, an insulator 544 is preferably provided between the insulator 580 and the oxide 530a, the oxide 530b, the conductor 542a, and the conductor 542b. In addition, as illustrated in FIG. 17A and FIG. 17B, the conductor 560 preferably includes a conductor 560a provided inside the insulator 550 and a conductor 560b provided to be embedded inside the conductor 560a. As illustrated in FIG. 17A and FIG. 17B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 12 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 12, the present invention is not limited thereto. For example, the conductor 560 may have a single-layer structure or a stacked-layer structure of three or more layers. The transistor 12 illustrated in FIG. 15, FIG. 16, FIG. 17A, and FIG. 17B is an example, and the structure is not limited thereto; an appropriate transistor can be used in accordance with a circuit structure or a driving method.

Here, the conductor 560 functions as a gate electrode of the transistor 12, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, the gate electrode can be positioned between the source electrode and the drain electrode in a self-aligned manner in the transistor 12. Thus, the conductor 560 can be formed without an alignment margin, resulting in a reduction in the area occupied by the transistor 12. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 12 can be increased, and the transistor 12 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 12 can be controlled by changing a potential applied to the conductor 503 independently of a potential applied to the conductor 560. In particular, the threshold voltage of the transistor 12 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to include a region overlapping with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 12 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material which has a function of inhibiting diffusion of impurities such as a hydrogen atom, a hydrogen molecule, a water molecule, and a copper atom (through which the impurities are less likely to pass) is preferably used. Alternatively, it is preferable to use a conductive material which has a function of inhibiting diffusion of oxygen (e.g., at least one of an oxygen atom, an oxygen molecule, and the like) (through which the oxygen is less likely to pass). Note that in this specification and the like, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503a is not necessarily provided. Note that the conductor 503b is illustrated as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 12 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed by occurrence of a reaction in which a bond of VoH is cut, i.e., occurrence of a reaction of "VoH→Vo+H". Part of hydrogen generated at this time is bonded to oxygen to be H$_2$O, and removed from the oxide 530 or an insulator near the oxide 530 in some cases. Part of hydrogen is diffused into or gettered by the conductor 542 in some cases.

For the microwave treatment, for example, an apparatus including a power supply that generates high-density plasma or an apparatus including a power supply that applies RF to the substrate side is suitably used. High-density oxygen radicals can be generated using a gas containing oxygen and high-density plasma, for example. By applying RF to the substrate side, the oxygen radicals generated by high-density plasma can be introduced into the oxide 530 or the insulator near the oxide 530 efficiently. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O2/(O2+Ar)) is lower than or equal to 50%, preferably higher than or equal to 10% and lower than or equal to 30%.

In a manufacturing process of the transistor 12, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with oxygen supplied to the oxide 530, so that the hydrogen can be removed as H$_2$O (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the insulator 522 be less likely to transmit the above oxygen).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba, Sr)TiO_3$ (BST) are preferably used, for example. As miniaturization and high integration of transistors progress, a problem such as generation of leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (i.e., an insulating material through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 12 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride are suitable because they are thermally stable. Furthermore, when an insulator which is a high-k material is combined with silicon oxide or silicon oxynitride, the insulator 520 having a stacked-layer structure that has thermal stability and a high relative permittivity can be obtained.

Note that in the transistor 12 in FIG. 17A and FIG. 17B, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 12, a metal oxide functioning as an oxide semiconductor is preferably used as the oxide 530 including the channel formation region. For example, as the oxide 530, a metal oxide such as an In—M—Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (C-AxIs Aligned Crystal Oxide Semiconductor) or a CAC-OS (Cloud-Aligned Composite Oxide Semiconductor). Furthermore, as the oxide 530, an In—Ga oxide or an In—Zn oxide may be used. The CAAC-OS and the CAC-OS will be described later. Note that in order to increase the on-state current of the transistor 12, an In—Zn oxide is preferably used as the oxide 530. In the case where an In—Zn oxide is used as the oxide 530, for example, a stacked-layer structure in which an In—Zn oxide is used as the oxide 530a and In—M—Zn oxides are used as the oxide 530b and the oxide 530c, or a stacked-layer structure in which an In—M—Zn oxide is used as the oxide 530a and an In—Zn oxide is used as one of the oxide 530b and the oxide 530c can be employed.

A metal oxide with a low carrier concentration is preferably used for the transistor 12. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates electrons serving as carriers. Thus, a transistor using a metal oxide containing much hydrogen is likely to have normally-on characteristics. Moreover, hydrogen in a metal oxide is easily transferred by a stress such as heat or an electric field; thus, a large amount of hydrogen in a metal oxide might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is effective to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) in order to obtain a metal oxide whose VoH is sufficiently reduced. When a metal oxide with a sufficiently low concentration of impurities such as VoH is used for a channel formation region of a transistor, the transistor can have stable electrical characteristics.

A defect in which hydrogen has entered an oxygen vacancy can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$. When a metal oxide with a sufficiently low concentration of impurities such as hydrogen is used for a channel formation region of a transistor, the transistor can have stable electrical characteristics.

When a metal oxide is used as the oxide 530, the carrier concentration of the metal oxide in the channel formation region is preferably lower than or equal to $1\times10^{18}$ cm', further preferably lower than $1\times10^{17}$ cm$^{-3}$, still further preferably lower than $1\times10^{16}$ cm$^{-3}$, yet further preferably lower than $1\times10^{13}$ cm$^3$, yet still further preferably lower than $1\times10^{12}$ cm$^3$. Note that the lower limit of the carrier concentration of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

Note that the layer is not necessarily formed between the conductor 542 and the oxide 530b. For example, the layer is formed between the conductor 542 and the oxide 530c in some cases. Alternatively, the layer is formed between the conductor 542 and the oxide 530b and between the conductor 542 and the oxide 530c in some cases.

The metal oxide functioning as the channel formation region in the oxide 530 has a bandgap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

Specifically, as the oxide 530a, a metal oxide having In:Ga:Zn=1:3:4 [atomic ratio] or 1:1:0.5 [atomic ratio] is used. As the oxide 530b, a metal oxide having In:Ga:Zn=4:2:3 [atomic ratio] or 1:1:1 [atomic ratio] is used. As the oxide 530c, a metal oxide having In:Ga:Zn=1:3:4 [atomic ratio], Ga:Zn=2:1 [atomic ratio], or Ga:Zn=2:5 [atomic ratio] is used. Specific examples of the oxide 530c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio] and, and a stacked-layer structure of gallium oxide and In:Ga:Zn=4:2:3 [atomic ratio].

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction becomes small, and the transistor 12 can have a high on-state current.

Note that a semiconductor material that can be used for the oxide 530 is not limited to the above metal oxides. A semiconductor material which has a band gap (a semiconductor material that is not a zero-gap semiconductor) can be used for the oxide 530. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 17, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 17A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with the inner side (the top surface and the side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably has a function of inhibiting oxygen diffusion from the insulator 550 into the conductor 560. Providing the metal oxide having a function of inhibiting diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as generation of leakage current may arise because of a thinner gate insulating film. Therefore, when the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high relative permittivity.

Although the conductor 560 functioning as the first gate electrode has a two-layer structure in FIG. 17A and FIG. 17B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided to include a region in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high bather property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a bather film against impurities such as hydrogen.

An insulator 581 functioning as an interlayer film is preferably provided over the insulator 574. As in the insulator 524 or the like, the concentration of impurities such as water and hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A material having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors in a change in electrical characteristics of the transistor. Accordingly, aluminum oxide can prevent entry of impurities such as hydrogen and moisture into the transistor 12 in a manufacturing process and after manufacturing of the transistor. In addition, release of oxygen from the oxide included in the transistor 12 can be inhibited. Therefore, aluminum oxide is suitably used for a protective film of the transistor 12.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 14, the transistor 12, or the transistor 13. The conductor 546 and the conductor 548 can be provided using materials similar to those for the conductor 328 and the conductor 330.

After the transistor 12 is formed, an opening may be formed to surround the transistor 12 and an insulator having a high barrier property against hydrogen or water may be formed to cover the opening. Surrounding the transistor 12 by the insulator having a high barrier property can prevent entry of moisture and hydrogen from the outside. Alternatively, a plurality of transistors 12 may be collectively surrounded by the insulator having a high barrier property against hydrogen or water. When an opening is formed to surround the transistor 12, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 12. The insulator having a high barrier property against hydrogen or water is formed using a material similar to that as the insulator 522, for example.

Subsequently, the capacitor 14 is provided above the transistor 12. The capacitor 14 includes a conductor 610, a conductor 620, and an insulator 630.

In addition, a conductor 612 may be provided over the conductor 546 and the conductor 548. The conductor 612 has a function of a plug or a wiring that is connected to the transistor 12. The conductor 610 has a function of an electrode of the capacitor 14. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added can be used.

Although the conductor 612 and the conductor 610 each having a single-layer structure are illustrated in FIG. 15, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

Using the structure, a semiconductor device using a transistor including an oxide semiconductor can be miniaturized or highly integrated.

Figure 18A:
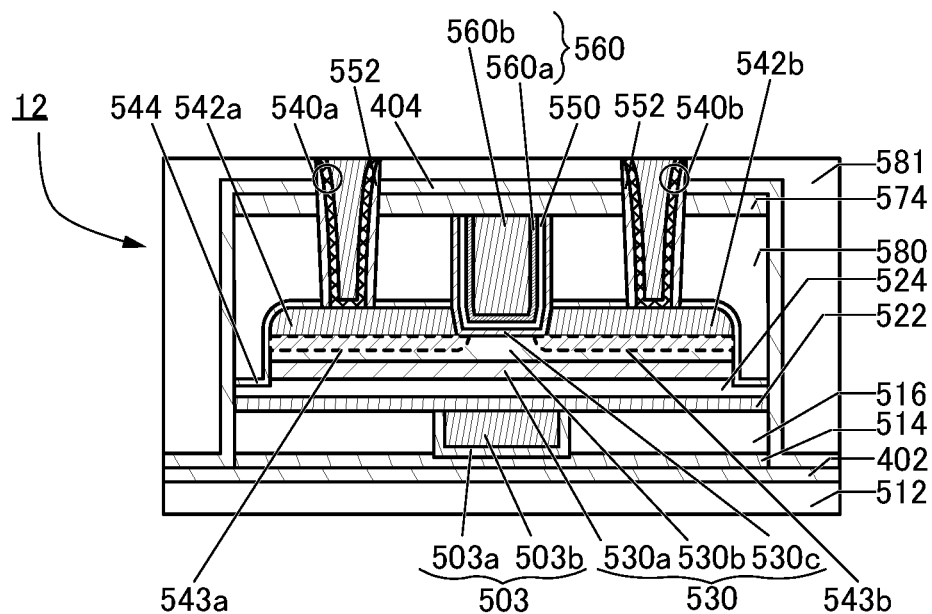
FIG. 18A and FIG. 18B are schematic cross-sectional views illustrating a structure example of a transistor.
Figure 18B:
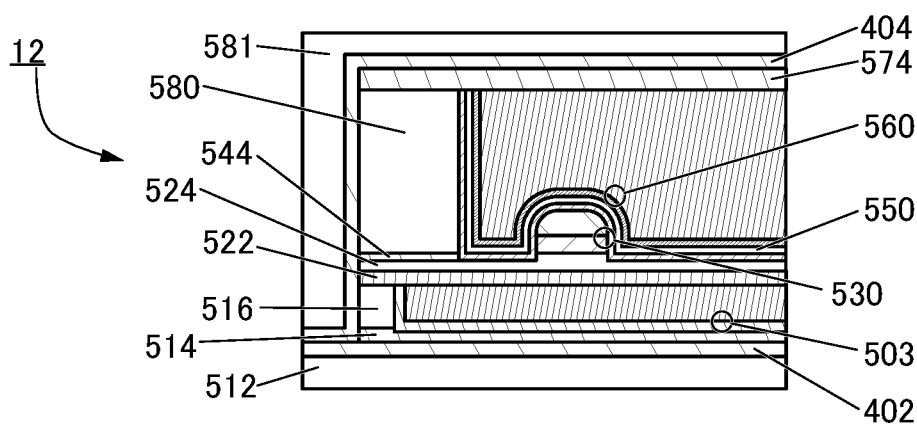

FIG. 18A and FIG. 18B show a modification example of the transistor 12 illustrated in FIG. 17A and FIG. 17B. FIG. 17A is a cross-sectional view of the transistor 12 in the channel length direction, and FIG. 17B is a cross-sectional view of the transistor 12 in the channel width direction. The structure illustrated in FIG. 18A and FIG. 18B can also be used for other transistors such as the transistor 13 included in the semiconductor device of one embodiment of the present invention.

FIG. 18A is a cross-sectional view of the transistor 12 in the channel length direction, and FIG. 18B is a cross-sectional view of the transistor 12 in the channel width direction. The transistor 12 illustrated in FIG. 18A and FIG. 18B is different from the transistor 12 illustrated in FIG. 17A and FIG. 17B in that an insulator 402 and an insulator 404 are included. In addition, the transistor 12 illustrated in FIG. 18A and FIG. 18B is different from the transistor 12 illustrated in FIG. 17A and FIG. 17B in that an insulator 552 is provided in contact with a side surface of the conductor 540*a* and the insulator 552 is provided in contact with a side surface of the conductor 540*b*. Moreover, the transistor 12 illustrated in FIG. 18A and FIG. 18B is different from the transistor 12 illustrated in FIG. 17A and FIG. 17B in that the insulator 520 is not included.

In the transistor 12 illustrated in FIG. 18A and FIG. 18B, the insulator 402 is provided over the insulator 512. The insulator 404 is provided over the insulator 574 and the insulator 402.

In the structure of the transistor 12 illustrated in FIG. 18A and FIG. 18B, the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, the side surface of the insulator 574, the side surface of the insulator 580, the side surface of the insulator 544, the side surface of the insulator 524, the side surface of the insulator 522, the side surface of the insulator 516, the side surface of the insulator 514, and the top surface of the insulator 402. Thus, the oxide 530 and the like are isolated from the outside by the insulator 404 and the insulator 402.

It is preferable that the insulator 402 and the insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide that is a material having a high hydrogen barrier property. This can inhibit diffusion of hydrogen or the like into the oxide 530, thereby suppressing the degradation of the characteristics of the transistor 12. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen bather property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

Figure 19:
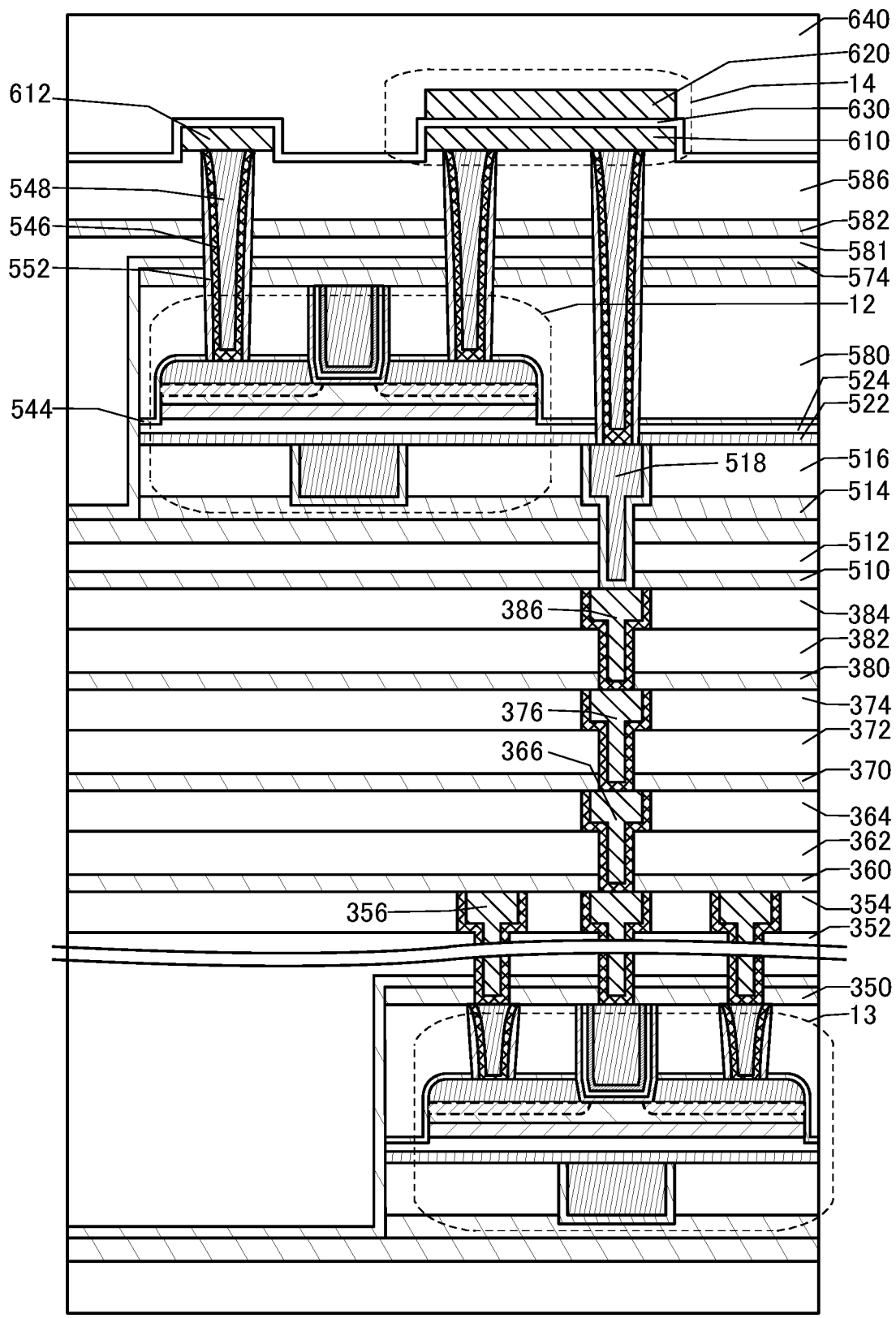
FIG. 19 is a schematic cross-sectional view illustrating a structure example of a semiconductor device.

FIG. 19 is a cross-sectional view illustrating a structure example of the semiconductor device in the case where the transistor 12 and the transistor 13 have the structure illustrated in FIG. 18A and FIG. 18B. The insulator 552 is provided on the side surface of the conductor 546.

This embodiment can be implemented in an appropriate combination with the structures described in the other embodiments and the like.

Embodiment 3

In this embodiment, the compositions of a CAC-OS and a CAAC-OS, which are metal oxides that can be used in the OS transistor described in the above embodiments, will be described. Note that in this specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries bluffed.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M in the (M, Zn) layer is replaced with indium, the layer can also be referred to as an (In, M, Zn) layer. When indium in the In layer is replaced with the element M, the layer can be referred to as an (In, M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of the oxide semiconductor; thus, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to stabilize the electrical characteristics of the transistor, reducing the impurity concentration in the oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be implemented in an appropriate combination with the structures described in the other embodiments and the like.

Embodiment 4

In this embodiment, a memory device using the semiconductor device 10 described in Embodiment 1 will be described.

<Memory Device>

Figure 20:
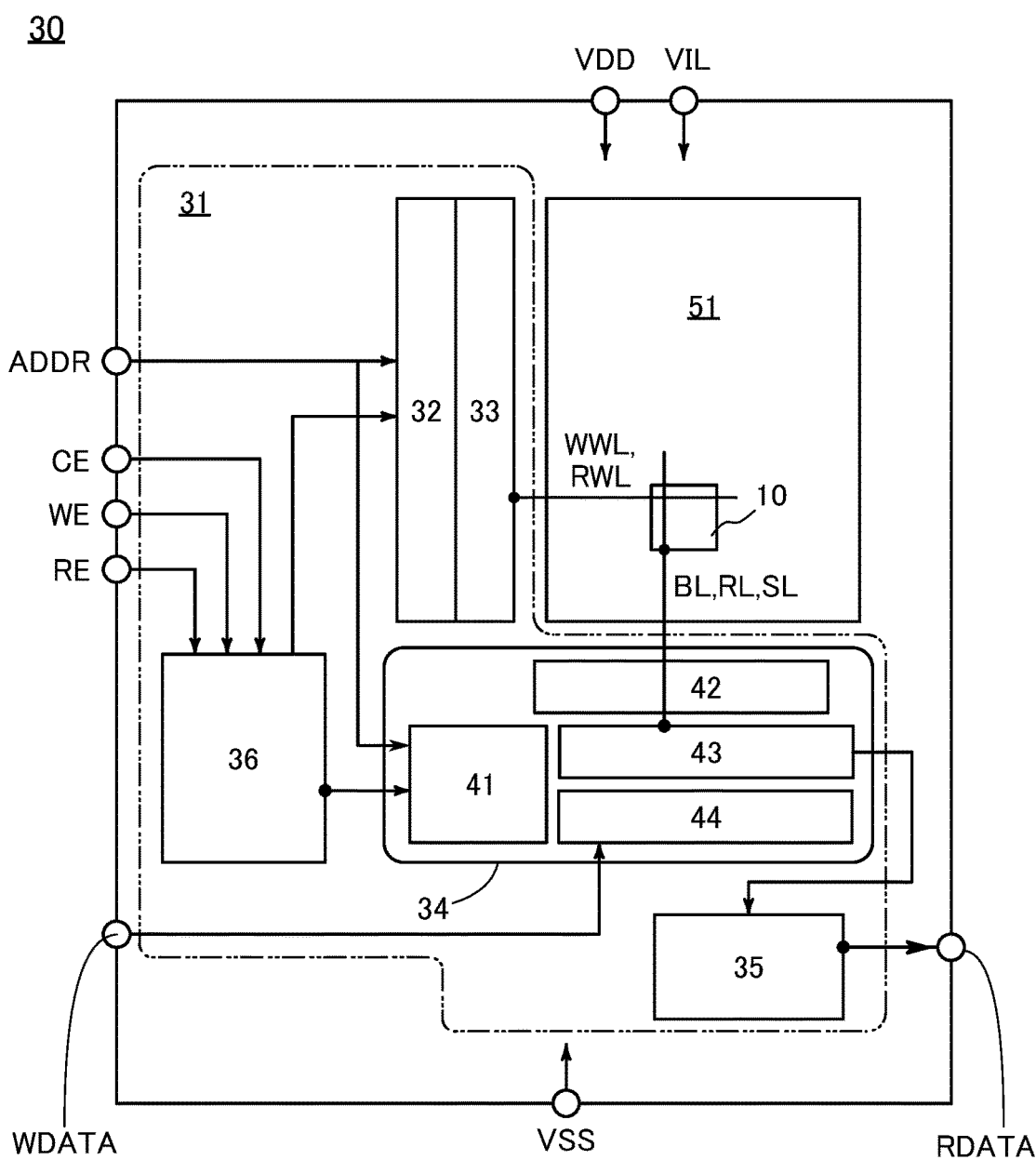
FIG. 20 is a block diagram illustrating a structure example of a memory device.

FIG. 20 is a block diagram illustrating a structure example of a memory device. A memory device 30 includes a peripheral circuit 31 and a cell array 51. The peripheral circuit 31 includes a row decoder 32, a word line driver circuit 33, a bit line driver circuit 34, an output circuit 35, and a control logic circuit 36.

The word line driver circuit 33 has a function of supplying a potential to a wiring WL. The bit line driver circuit 34 includes a column decoder 41, a precharge circuit 42, an amplifier circuit 43, and a write circuit 44. The precharge circuit 42 has a function of precharging the wiring RL and the like. The amplifier circuit 43 has a function of amplifying a data signal read from the wiring RL. Note that as described in Embodiment 1 above, the wiring WWL, the wiring RWL, the wiring SL, the wiring BL, and the wiring RL are wirings which are connected to the semiconductor device 10 functioning as a memory cell included in the cell array 51. The amplified data signal is output to the outside of the memory device 30 as a digital data signal RDATA through the output circuit 35.

As power supply voltages, a low power supply voltage (VSS), a high power supply voltage (VDD) for the peripheral circuit 31, and a high power supply voltage (VIL) for the cell array 51 are supplied to the memory device 30 from the outside.

Control signals (CE, WE, RE), an address signal ADDR, and a data signal WDATA are input to the memory device 30 from the outside. The address signal ADDR is input to the row decoder 32 and the column decoder 41, and WDATA is input to the write circuit 44.

The control logic circuit 36 processes the signals (CE, WE, RE) input from the outside, and generates control signals for the row decoder 32 and the column decoder 41. CE is a chip enable signal, WE is a write enable signal, and RE is a read enable signal. Signals processed by the control logic circuit 36 are not limited thereto, and other control signals may be input as necessary.

Note that whether each circuit or each signal described above is provided or not can be appropriately determined as needed.

OS transistors can be used as transistors included in the cell array 51. Moreover, OS transistors can be used as transistors included in the peripheral circuit 31. When the cell array 51 and the peripheral circuit 31 are formed using OS transistors, the cell array 51 and the peripheral circuit 31 can be formed in the same manufacturing process, and the manufacturing cost can be kept low.

Structure Example of Cell Array

Figure 21:
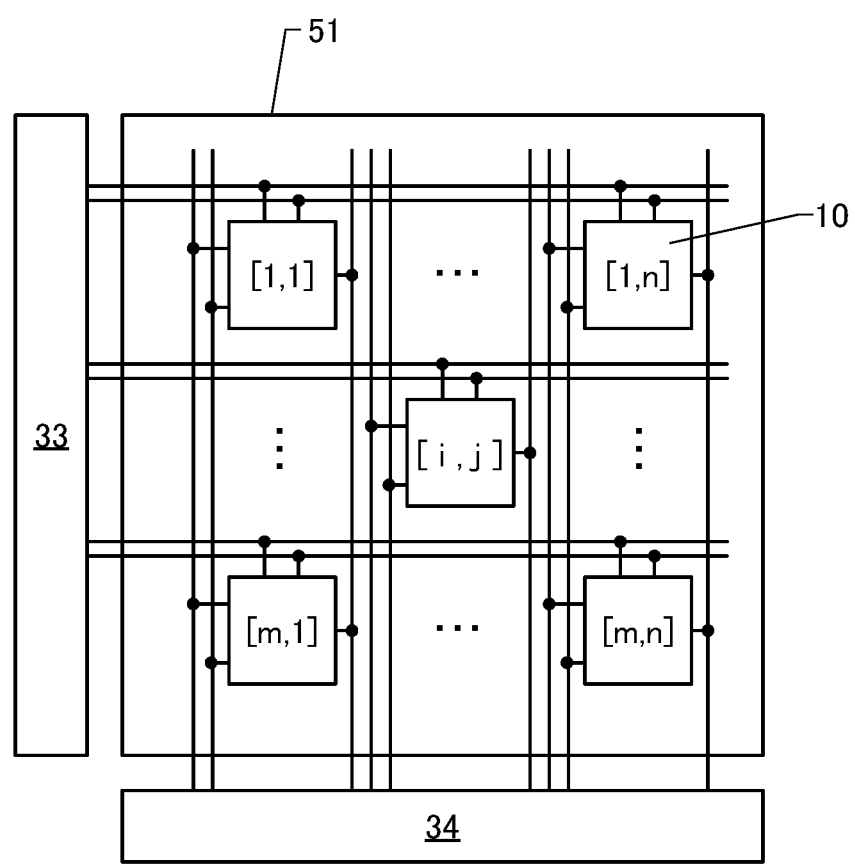
FIG. 21 is a block diagram illustrating a structure example of a memory cell array.

FIG. 21 illustrates the details of the cell array 51. The cell array 51 includes the semiconductor devices 10 functioning as m (m is an integer greater than or equal to 1) memory cells in one column and n (n is an integer greater than or equal to 1) memory cells in one row, i.e., m×n memory cells in total, and the semiconductor devices 10 are arranged in a matrix as exemplified in FIG. 10, FIG. 12, and FIG. 14. FIG. 21 also shows addresses of the semiconductor devices 10 and shows the semiconductor devices 10 positioned at addresses of [1,1], [m,1], [i,j], [1, n], and [m,n] (i is an integer of 1 to m, and j is an integer of 1 to n). Note that the number of wirings that connect the cell array 51 and the word line driver circuit 33 depends on the structure of the semiconductor device 10, the number of semiconductor devices 10 included in one column, or the like. The number of wirings that connect the cell array 51 and the bit line driver circuit 34 depends on the structure of the semiconductor device 10, the number of semiconductor devices 10 included in one row, or the like.

With the structure of the semiconductor device 10, data rewriting and data reading become possible by charging or discharging of electric charge; thus, a substantially unlimited number of times of data writing and data reading are possible. In data reading, data can be read without discharging of retained electric charge, i.e., destructive reading; therefore, power consumption due to charging and discharging of electric charge required for data refreshing can be reduced.

With the structure of the semiconductor device 10, the amount of electric charge required when data is written back can be reduced. Therefore, data can be read without discharging of retained electric charge to a wiring with large electrostatic capacitance, or the like. A highly reliable semiconductor device that retains data for a long time can be obtained.

Embodiment 5

In this embodiment, examples of electronic components and electronic devices in which the memory device or the like described in the above embodiment is incorporated will be described.

<Electronic Component>

First, examples of electronic components in which the memory device 300 is incorporated will be described with reference to FIG. 22A and FIG. 22B.

Figure 22A:
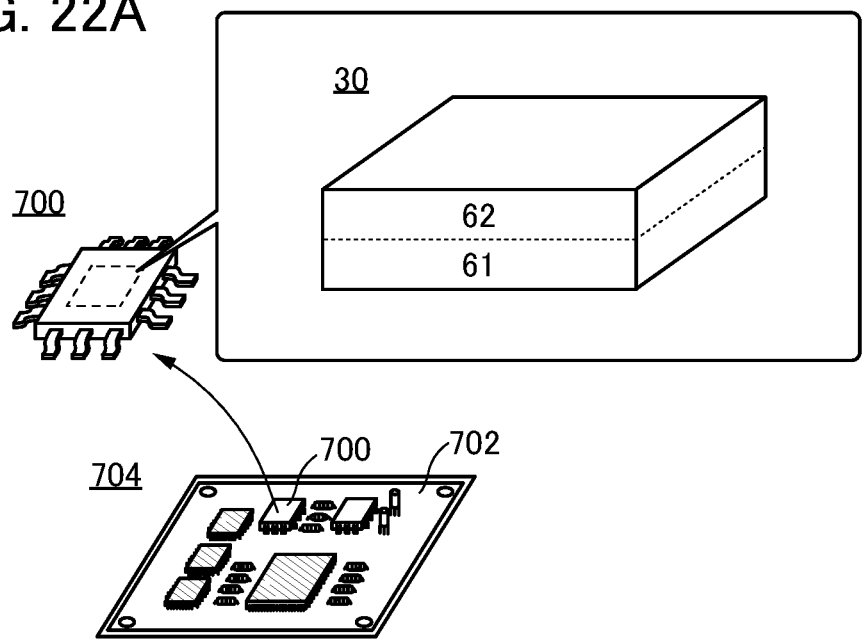
FIG. 22A and FIG. 22B are diagrams illustrating examples of electronic components.

FIG. 22A is a perspective view of an electronic component 700 and a substrate (a mounting board 704) on which the electronic component 700 is mounted. The electronic component 700 illustrated in FIG. 22A is an IC chip and includes a lead and a circuit portion. The electronic component 700 is mounted on a printed circuit board 702, for example. A plurality of such IC chips are combined and electrically connected to each other on the printed circuit board 702, whereby the mounting board 704 is completed.

The memory device 30 described in the above embodiment is provided as the circuit portion of the electronic component 700. Although a QFP (Quad Flat Package) is used as the package of the electronic component 700 in FIG. 22A, the mode of the package is not limited thereto. In the memory device, a layer 61 provided with Si transistors and a layer 62 provided with OS transistors are stacked.

Figure 22B:
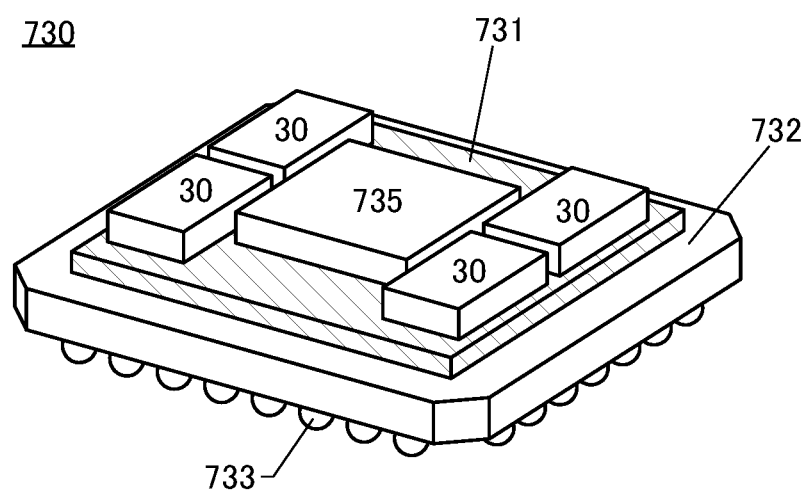

FIG. 22B is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 30 are provided on the interposer 731.

The electronic component 730 using the memory devices 30 as high bandwidth memory (HBM) is illustrated as an example. An integrated circuit (semiconductor device) such as a CPU (Central Processing Unit), a GPU (Graphic Processing Unit), or an FPGA (Field Programmable Gate Array) can be used for the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory devices 30 and the semiconductor device 735 are preferably equal to each other.

To mount the electronic component 730 on another substrate, an electrode 733 may be provided on the bottom portion of the package substrate 732. FIG. 22B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 23:
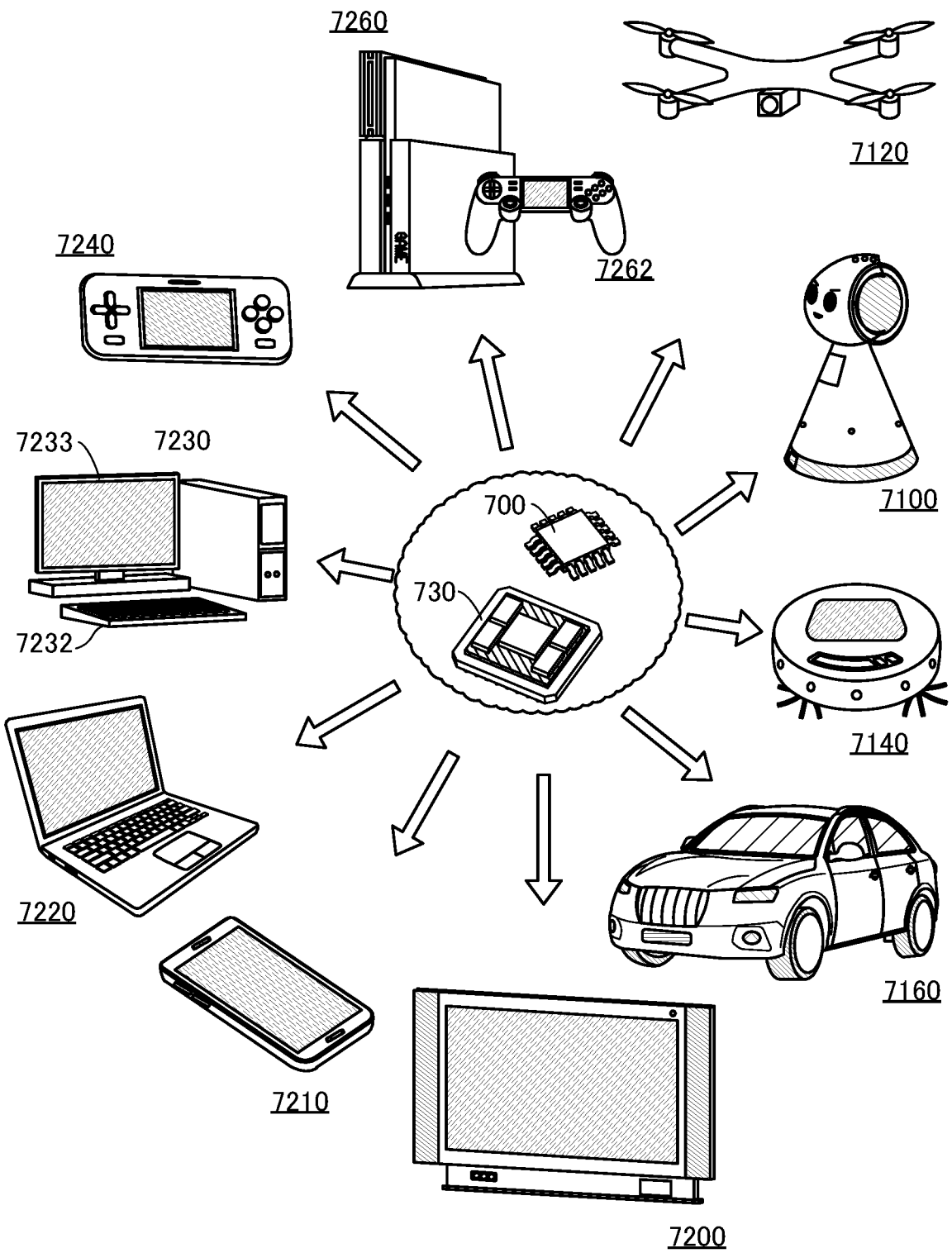
FIG. 23 is a diagram illustrating examples of electronic devices.

Next, examples of electronic devices including the above electronic component will be described with reference to FIG. 23.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

The automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

This embodiment can be implemented in combination with any of the structures described in the other embodiments and the like, as appropriate.

(Notes on Description of this Specification and the Like)

The description of the above embodiments and each structure in the embodiments are noted below.

One embodiment of the present invention can be constituted by combining, as appropriate, the structure described in each embodiment with any of the structures described in the other embodiments and Examples. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

Furthermore, the positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) for the other of the source and the drain are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electric signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electric signal transmission between A and B through a wiring (or an electrode) or the like, not through the above object. In other words, direct connection refers to connection that can be regarded as the same circuit diagram when indicated as an equivalent circuit.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

BL_1: wiring, MN1: node, MN2: node, RL_1: wiring, RWL_1: wiring, SL_1: wiring, SL_2: wiring, T1: period, T2: period, T3: period, T4: period, T5: period, T6: period, T7: period, T8: period, T9: period, WWL_1: wiring, WWL_2: wiring, 10: semiconductor device, 10_1: semiconductor device, 104: semiconductor device, 10A: semiconductor device, 10B: semiconductor device, 10C: semiconductor device, 10D: semiconductor device, 10E: semiconductor device, 10F: semiconductor device, 10G: semiconductor device, 11: transistor, 11A: transistor, 11B: transistor, 11C: transistor, 11D: transistor, 11E: transistor, 11F: transistor, 11G: transistor, 12: transistor, 12A: transistor, 12B: transistor, 12C: transistor, 12D: transistor, 12E: transistor, 12F: transistor, 12G: transistor, 13: transistor, 13A: transistor, 13B: transistor, 13C: transistor, 13D: transistor, 13E: transistor, 13G: transistor, 14: capacitor, 15: charge retention circuit, 30: memory device, 31: peripheral circuit, 32: row decoder, 33: word line driver circuit, 34: bit line driver circuit, 35: output circuit, 36: control logic circuit, 41: column decoder, 42: precharge circuit, 43: amplifier circuit, 44: circuit, 51: cell array, 61: layer, 62: layer, 300: memory device, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 540a: conductor, 540b: conductor, 542: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 610: conductor, 612: conductor, 620: conductor, 630: insulator, 640: insulator, 700: electronic component, 702: printed circuit board, 704: mounting board, 730: electronic component, 731: interposer, 732: package substrate, 733: electrode, 735: semiconductor device, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller

The invention claimed is:

1. A semiconductor device comprising:
a first transistor;
a second transistor; and
a third transistor,
wherein one of a source and a drain of the first transistor is electrically connected to a first wiring for reading data,
wherein one of a source and a drain of the second transistor is electrically connected to a first node and a gate of the first transistor,
wherein the other of the source and the drain of the second transistor is electrically connected to a second wiring for writing the data,
wherein one of a source and a drain of the third transistor is electrically connected to the first node and the gate of the first transistor,
wherein the other of the source and the drain of the third transistor is electrically connected to a second node and a capacitor for retaining electric charge corresponding to the data,
wherein the third transistor comprises a metal oxide in a channel formation region, and
wherein during data retention operation, a potential of the first node is changed to be different from a potential of the second node by turning off the third transistor while the second transistor is in a conduction state.

2. The semiconductor device according to claim 1, wherein the second transistor comprises a metal oxide in a channel formation region.

3. The semiconductor device according to claim 2, wherein the first transistor comprises silicon in a channel formation region.

4. The semiconductor device according to claim 1, wherein the first wiring and the second wiring are the same wiring.

5. An electronic device comprising:
the semiconductor device according to claim 1 and a housing.

6. An operation method of a semiconductor device comprising first to third transistors, the operation method comprising the steps of:
a first step of bringing the second transistor and the third transistor into a conduction state;
a second step of bringing the third transistor into a non-conduction state; and
a third step of bringing the second transistor into a non-conduction state and bringing the third transistor into a conduction state after the second step,
wherein one of a source and a drain of the first transistor is electrically connected to a first wiring for reading data,
wherein one of a source and a drain of the second transistor is electrically connected to a first node and a gate of the first transistor, wherein the other of the source and the drain of the second transistor is electrically connected to a second wiring for writing the data, wherein one of a source and a drain of the third transistor is electrically connected to the first node and the gate of the first transistor, wherein the other of the source and the drain of the third transistor is electrically connected to a second node and a capacitor for retaining electric charge corresponding to the data, wherein the third transistor comprises a metal oxide in a channel formation region, and wherein after the second step, a potential of the first node is changed to be different from a potential of the second node.

7. The operation method according to claim 6, wherein the first step of bringing the second transistor and the third transistor into a conduction state is data writing operation, wherein the second step of bringing the third transistor into a non-conduction state is data retention operation, and wherein the third step of bringing the second transistor into a non-conduction state and bringing the third transistor into a conduction state is data reading operation.

8. The operation method according to claim 6, further comprising the steps of:

a fourth step of bringing the third transistor into a non-conduction state, and a fifth step of bringing the second transistor into a non-conduction state.

* * * * *